United States Patent
Sakai

(10) Patent No.: US 9,450,259 B2
(45) Date of Patent: Sep. 20, 2016

(54) IMPEDANCE MEASURING DEVICE AND CONTROL METHOD FOR IMPEDANCE MEASURING DEVICE

(71) Applicant: NISSAN MOTOR CO., LTD., Yokohama-shi, Kanagawa (JP)

(72) Inventor: Masanobu Sakai, Yokohama (JP)

(73) Assignee: NISSAN MOTOR CO., LTD., Yokohama-Shi (JP)

( * ) Notice: Subject to any disclaimer, the term of this patent is extended or adjusted under 35 U.S.C. 154(b) by 0 days.

(21) Appl. No.: 14/774,474

(22) PCT Filed: Jan. 23, 2014

(86) PCT No.: PCT/JP2014/051373
§ 371 (c)(1),
(2) Date: Sep. 10, 2015

(87) PCT Pub. No.: WO2014/141752
PCT Pub. Date: Sep. 18, 2014

(65) Prior Publication Data
US 2016/0028095 A1  Jan. 28, 2016

(30) Foreign Application Priority Data
Mar. 12, 2013 (JP) ................. 2013-049416

(51) Int. Cl.
*G01N 27/416* (2006.01)
*H01M 8/04* (2016.01)
*G01R 31/36* (2006.01)
*H01M 8/10* (2016.01)

(52) U.S. Cl.
CPC ...... *H01M 8/04649* (2013.01); *G01R 31/3606* (2013.01); *G01R 31/3651* (2013.01); *G01R31/3662* (2013.01); *G01R 31/3648* (2013.01); *H01M 2008/1095* (2013.01); *Y02E 60/50* (2013.01)

(58) Field of Classification Search
CPC .......... G01R 31/3606; G01R 31/3651; G01R 31/3662; G01R 31/3648; H01M 2008/1095; H01M 8/04649; Y02E 60/50
USPC .......................................... 429/430; 324/430
See application file for complete search history.

(56) References Cited

U.S. PATENT DOCUMENTS

| 5,862,515 A | 1/1999 | Kobayashi et al. |
| 2009/0226770 A1* | 9/2009 | Manabe ............ H01M 8/04567 429/431 |
| 2011/0101986 A1* | 5/2011 | Shen .................. G01R 31/3662 324/430 |

FOREIGN PATENT DOCUMENTS

| JP | 56-112662 A | 9/1981 |
| JP | 09-281202 A | 10/1997 |
| JP | 2010-267472 A | 11/2010 |
| WO | WO 2012/077450 A1 | 6/2012 |

* cited by examiner

*Primary Examiner* — Nathaniel Pelton
(74) *Attorney, Agent, or Firm* — Foley & Lardner LLP

(57) ABSTRACT

An impedance measuring device outputs an AC signal having a predetermined frequency to each of a positive electrode terminal and a negative electrode terminal of the fuel cell. The impedance measuring device includes a detection unit that detects an AC potential difference between the positive electrode terminal and a midpoint of the fuel cell, and an adjustment unit that adjusts an amplitude of the AC signal to adjust a detection signal to a predetermined value. The impedance measuring device includes an in-phase component extraction unit that multiplies the detection signal by an in-phase signal and extracts a resistance component of the detection signal, and a calculation unit that calculates a positive real axis impedance on the basis of the resistance component and the output signal. The impedance measuring device includes an orthogonal component extraction unit that multiplies the detection signal by an orthogonal signal and extracts a capacitance component of the detection signal, and a reproduction unit reproduces a vector value of the detection signal on the basis of the extracted capacitance component and resistance component. The adjustment unit adjusts the amplitude of the AC signal so that the reproduced vector value equals the predetermined value.

5 Claims, 15 Drawing Sheets

IMPEDANCE MEASURING DEVICE AND CONTROL METHOD FOR IMPEDANCE MEASURING DEVICE

TECHNICAL FIELD

The present invention relates to an impedance measuring device that measures the impedance of a fuel cell, and to a control method therefor.

BACKGROUND ART

WO 2012077450 suggests an internal resistance measuring device that measures the internal resistance of a fuel cell while the fuel cell is supplying electric power to a load.

In order to ensure measurement accuracy, this internal resistance measuring device outputs the same AC signal to a positive electrode terminal and a negative electrode terminal of the fuel cell so that current does not leak to the load side. The amplitude of the AC signal output to each of the electrode terminals is adjusted so that a potential difference obtained by subtracting the electric potential at an intermediate terminal located between the positive electrode terminal and the negative electrode terminal of the fuel cell from the electric potential at the positive electrode terminal matches a potential difference obtained by subtracting the electric potential at the intermediate terminal from the electric potential at the negative electrode terminal. The internal resistance of the fuel cell is measured on the basis of the output AC signal that has been adjusted and the potential difference signal.

SUMMARY OF INVENTION

However, capacitance components are present inside the fuel cell. This capacitance fluctuates significantly depending on the operation state of the fuel cell. With such a fluctuation in the capacitance, the potential difference signal becomes out of phase with the output AC signal from the internal resistance measuring device.

Once the potential difference signal has become out of phase, the detection level (the effective value, for example) of the potential difference signal becomes lower than a target value. Therefore, if the amplitude of the AC signal is adjusted using such an out-of-phase potential difference signal, the amplitude of the AC signal increases excessively. As a result, the impedance is measured using the excessively-amplified output AC signal. This leads to a problem of lowered measurement accuracy.

The present invention has been made in view of the above problem. It is an object of the present invention to suppress a decrease in the measurement accuracy of the internal impedance of a fuel cell.

An impedance measuring device according to one aspect of the present invention measures of an impedance a fuel cell having a plurality of stacked battery cells, a capacitance component, and a resistance component, the capacitance component and the resistance component changing in accordance with a state of the battery cells. The impedance measuring device includes a positive output unit configured to be connected to a positive electrode terminal of the fuel cell, the positive output unit outputting an AC signal having a predetermined frequency for measuring an internal impedance of the fuel cell, and a negative output unit configured to be connected to a negative electrode terminal of the fuel cell, the negative output unit outputting the AC signal having the predetermined frequency. The impedance measuring device a detection unit configured to detect an AC potential difference between the positive electrode terminal and a midpoint of the fuel cell, and an adjustment unit configured to adjust an amplitude of the AC signal at the positive output unit so as to converge a detection signal indicating the AC potential difference on a predetermined value, the predetermined value bringing about a match between the detection signal indicating the AC potential difference and an AC potential difference between the negative electrode terminal and the midpoint. the impedance measuring device includes an in-phase component extraction unit configured to multiply the detection signal indicating the AC potential difference by an in-phase signal and extract a resistance component of the detection signal indicating the AC potential difference, the in-phase signal being in phase with the AC signal having the predetermined frequency, and a calculation unit configured to calculate a positive real axis impedance on the basis of the resistance component and the output signal. The impedance measuring device includes an orthogonal component extraction unit configured to multiply the detection signal indicating the AC potential difference by an orthogonal signal and extract a capacitance component of the detection signal indicating the AC potential difference, a phase of the orthogonal signal being orthogonal to a phase of the AC signal having the predetermined frequency, and a reproduction unit configured to reproduce a vector value of the detection signal indicating the AC potential difference on the basis of the extracted capacitance component and resistance component. The adjustment unit configured to adjust the amplitude of the AC signal at the positive output unit so that the reproduced vector value equals the predetermined value.

DESCRIPTION OF EMBODIMENTS

The following describes embodiments of the present invention with reference to the attached drawings.

First Embodiment

Figure 1A:
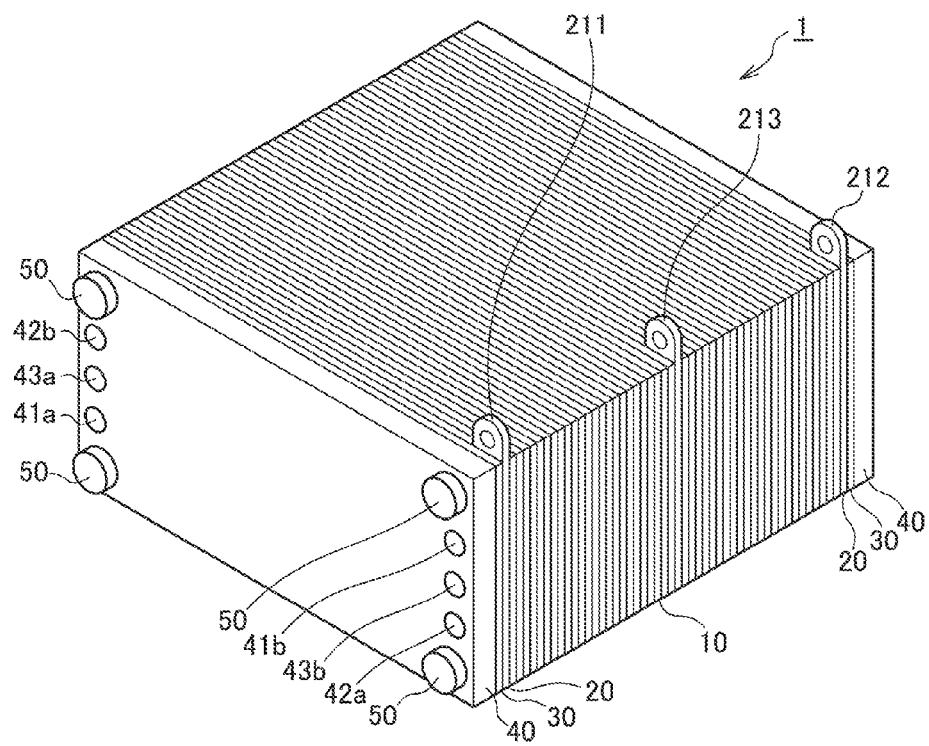
FIG. 1A is an external perspective view showing an example of a stacked battery serving as a measurement object for an impedance measuring device that performs equipotential control according to a first embodiment of the present invention.
Figure 1B:
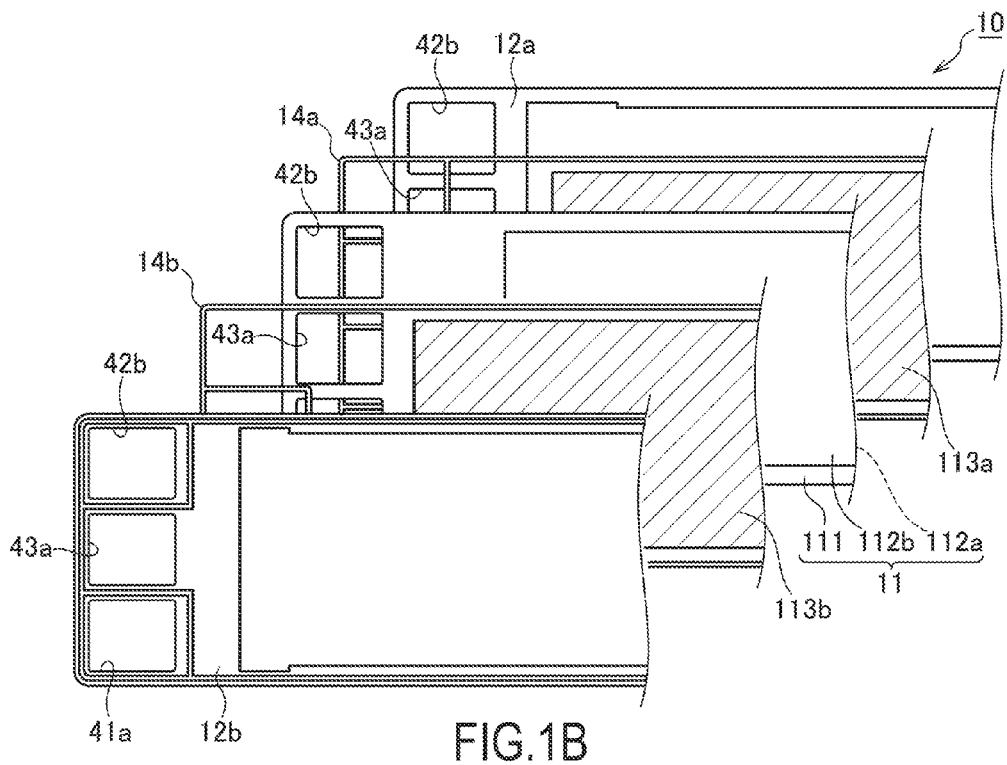
FIG. 1B is an exploded view showing a configuration of a power generation cell in a fuel cell.

FIG. 1A is an external perspective view showing an example of a stacked battery serving as a measurement object for an impedance measuring device according to a first embodiment of the present invention. FIG. 1A shows a fuel cell as an example of a stacked battery. FIG. 1B is an exploded view showing a configuration of a power generation cell in the fuel cell.

As shown in FIG. 1A, a fuel cell stack 1 includes a plurality of stacked power generation cells 10, current collecting plates 20, insulating plates 30, end plates 40, and four tension rods 50.

The power generation cells 10 are unit cells of the fuel cell. Each power generation cell 10 generates an electromotive voltage of, for example, approximately 1 volt (V). The configuration of each power generation cell 10 will be described later in detail.

The current collecting plates 20 are arranged on the outer sides of the plurality of stacked power generation cells 10. The current collecting plates 20 are formed of a gas impermeable conductive member, for example dense carbon. The current collecting plates 20 include a positive electrode terminal 211 and a negative electrode terminal 212. A midpoint terminal 213 is also provided between the positive electrode terminal 211 and the negative electrode terminal 212. The midpoint terminal 213 is connected to a battery cell that is located centrally among battery cells composed of a power generation cell connected to the positive electrode terminal 211 through to a power generation cell connected to the negative electrode terminal 212. It should be noted that the midpoint terminal 213 may be located at an intermediate point that does not positionally coincide with the midpoint between the positive electrode terminal 211 and the negative electrode terminal 212. In the fuel cell stack 1, the positive electrode terminal 211 and the negative electrode terminal 212 extract and output electrons e⁻ generated in each power generation cell 10.

The insulating plates 30 are arranged on the outer sides of the current collecting plates 20. The insulating plates 30 are formed of an insulating member, for example rubber.

The end plates 40 are arranged on the outer sides of the insulating plates 30. The end plates 40 are formed of stiff metallic material, for example steel.

One of the end plates 40 (in FIG. 1A, the end plate 40 on the front left side) is provided with an anode supply port 41a, an anode discharge port 41b, a cathode supply port 42a, a cathode discharge port 42b, a cooling water supply port 43a, and a cooling water discharge port 43b. In the present embodiment, the anode discharge port 41b, the cooling water discharge port 43b, and the cathode supply port 42a are provided on the right side in FIG. 1A. On the other hand, the cathode discharge port 42b, the cooling water supply port 43a, and the anode supply port 41a are provided on the left side in FIG. 1A.

The tension rods 50 are arranged in the vicinity of four corners of the end plate 40. Holes (not shown) that penetrate through the inside of the fuel cell stack 1 are formed in the fuel cell stack 1. The tension rods 50 are inserted into these through holes. The tension rods 50 are formed of stiff metallic material, for example steel. An insulation treatment has been applied to the surfaces of the tension rods 50 so as to prevent a short circuit among the power generation cells 10. The tension rods 50 and nuts (not shown due to their locations in the back) are screwed together. The tension rods 50 and the nuts clamp the fuel-cell stack 1 in a stacking direction.

Examples of a method of supplying hydrogen serving as an anode gas to the anode supply port 41a include a method of directly supplying a hydrogen gas from a hydrogen reservoir device, and a method of supplying reformed gas containing hydrogen which is obtained by reforming fuel containing hydrogen. It should be noted that examples of the hydrogen reservoir device include a high pressure gas tank, a liquid hydrogen tank, and a hydrogen storage alloy tank. Examples of fuel containing hydrogen include natural gas, methanol, and gasoline. Air is commonly used as a cathode gas supplied to the cathode supply port 42a.

As shown in FIG. 1B, each power generation cell 10 is configured by arranging an anode separator (anode bipolar plate) 12a and a cathode separator (cathode bipolar plate) 12b on both surfaces of a membrane electrode assembly (MEA) 11.

The MEA 11 includes an electrolyte membrane 111 made of an ion exchange membrane, as well as electrode catalyst layers 112 formed on both surfaces of the electrolyte membrane 111. Gas diffusion layers (GDLs) 113 are formed on the electrode catalyst layers 112.

The electrode catalyst layers 112 are formed of, for example, carbon black particles on which platinum is supported.

The GDLs 113 are formed of a conductive member with sufficient gas diffusion properties, for example carbon fibers.

An anode gas supplied from the anode supply port 41a flows through a GDL 113a, reacts with the anode electrode catalyst layer 112 (112a), and is then discharged from the anode discharge port 41b.

A cathode gas supplied from the cathode supply port 42a flows through a GDL 113b, reacts with the cathode electrode catalyst layer 112 (112b), and then is discharged from the cathode discharge port 42b.

The anode separator 12a overlies one surface (the back surface in FIG. 1B) of the MEA 11 via the GDL 113a and a seal 14a. The cathode separator 12b overlies one surface (the front surface in FIG. 1B) of the MEA 11 via the GDL 113b and a seal 14b. The seals 14 (14a, 14b) are made of elastic, rubber-like material such as silicone rubber, ethylene propylene diene monomer (EPDM), and fluororubber. Each of the anode separator 12a and the cathode separator 12b is formed from press molding of a separator substrate made of metal such as stainless steel. Through the press molding, reactant gas flow paths are formed on one surface thereof, and cooling water flow paths are formed on the other surface thereof so as to alternate with the reaction gas flow paths. The cooling water flow paths are formed by placing the anode separator 12a and the cathode separator 12b over each other as shown in FIG. 1B.

Holes 41a, 41b, 42a, 42b, 43a, 43b are formed in each of the MEA 11, the anode separator 12a, and the cathode separator 12b. These holes overlie one another to form the anode supply port (anode supply manifold) 41a, the anode discharge port (anode discharge manifold) 41b, the cathode supply port (cathode supply manifold) 42a, the cathode discharge port (cathode discharge manifold) 42b, the cooling water supply port (cooling water supply manifold) 43a, and the cooling water discharge port (cooling water discharge manifold) 43b.

Figure 2:
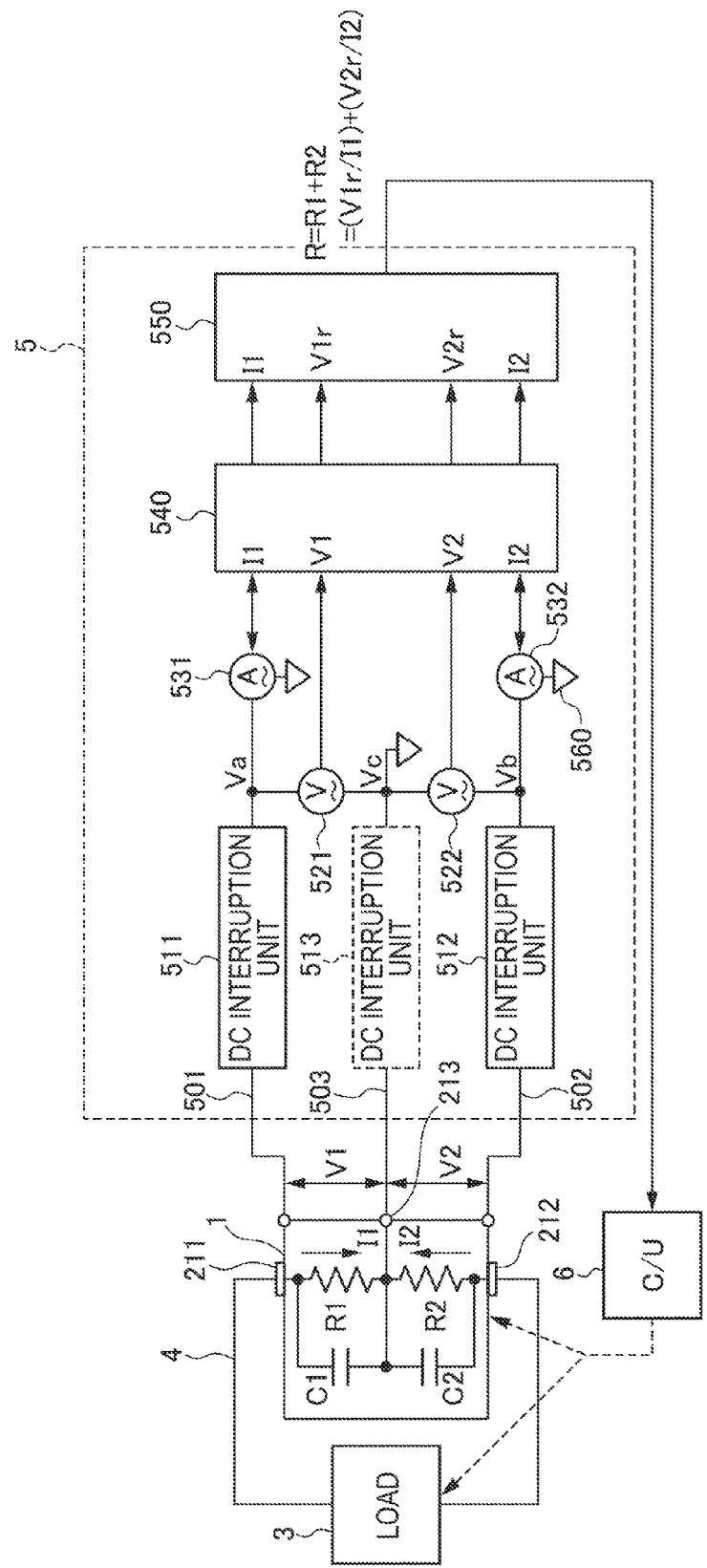
FIG. 2 is a circuit diagram showing the details of the impedance measuring device.

FIG. 2 is a circuit diagram showing an impedance measuring device for performing equipotential control according to the present embodiment.

An impedance measuring device 5 includes a positive DC interruption unit 511, a negative DC interruption unit 512, a midpoint DC interruption unit 513, a positive potential difference detection unit 521, a negative potential difference detection unit 522, a positive power source unit 531, a negative power source unit 532, an AC adjustment unit 540, and a resistance calculation unit 550.

Figure 3:
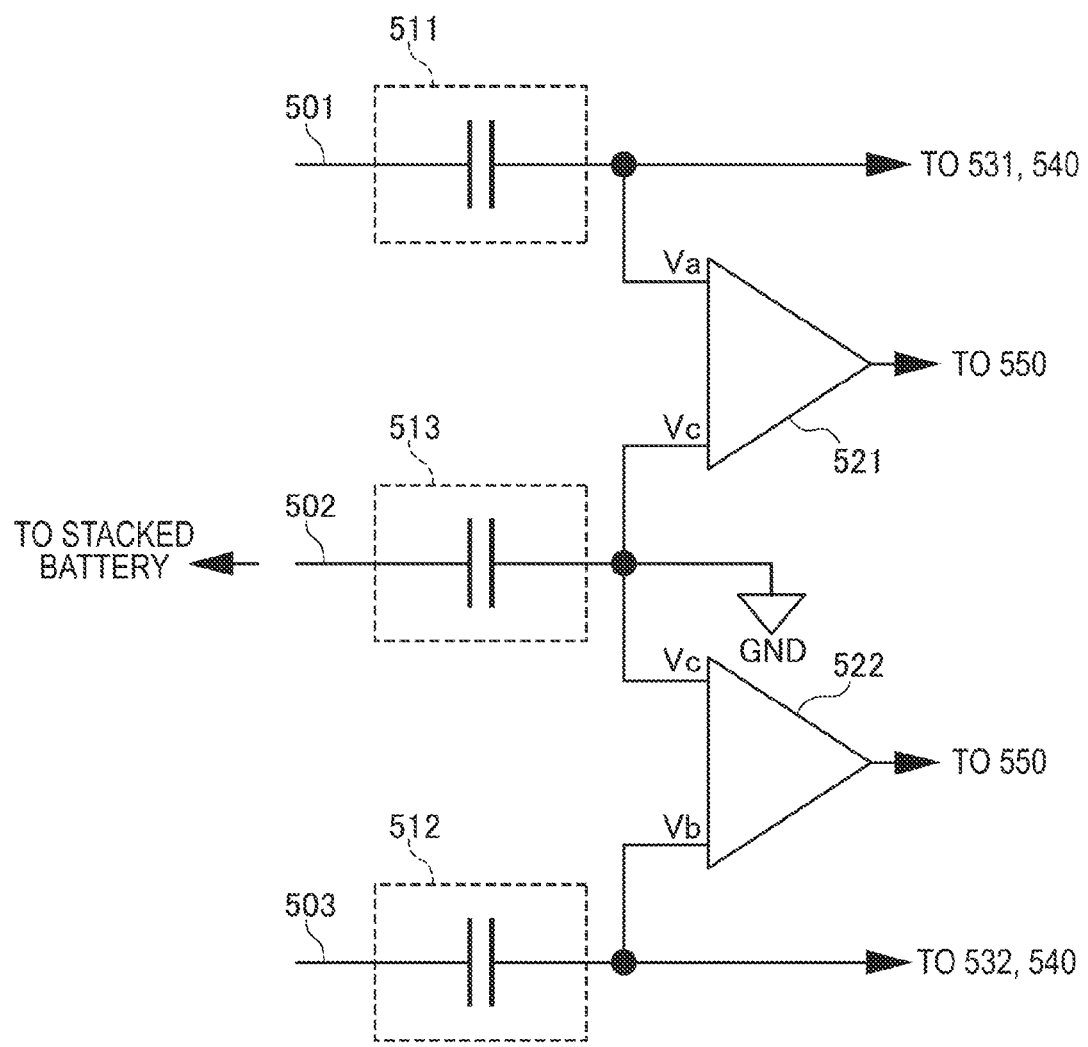
FIG. 3 is a circuit diagram showing a DC interruption unit and a potential difference detection unit of the impedance measuring device.

The details of the positive DC interruption unit 511, the negative DC interruption unit 512, the midpoint DC interruption unit 513, the positive potential difference detection unit 521, and the negative potential difference detection unit 522 will be described later with reference to FIG. 3.

The positive DC interruption unit 511 is connected to the positive electrode terminal 211 of the fuel cell stack 1. The negative DC interruption unit 512 is connected to the negative electrode terminal 212 of the fuel cell stack 1. The midpoint DC interruption unit 513 is connected to the midpoint terminal 213 of the fuel cell stack 1. It should be noted that the midpoint terminal 213 is located between the positive electrode terminal 211 and the negative electrode terminal 212. The midpoint DC interruption unit 513, which is indicated by a dashed line, may not be provided. These DC interruption units 511 to 513 interrupt DC signals, but allow AC signals to flow therethrough. The DC interruption units 511 to 513 are, for example, capacitors and transformers.

The positive potential difference detection unit 521 detects a potential difference between an AC potential Va at the positive electrode terminal 211 and an AC potential Vc at the midpoint terminal 213 (hereinafter referred to as "AC potential difference V1"). The positive potential difference detection unit 521 outputs, to the AC adjustment unit 540 and the resistance calculation unit 550, a detection signal whose signal level changes in accordance with the AC potential difference V1 (hereinafter also referred to as "detection signal indicating a positive AC potential difference").

The negative potential difference detection unit 522 detects an AC potential difference V2 between an AC potential Vb at the negative electrode terminal 212 and the AC potential Vc at the midpoint terminal 213. The negative potential difference detection unit 522 outputs, to the AC adjustment unit 540 and the resistance calculation unit 550, a detection signal whose signal level changes in accordance with the AC potential difference V2 (hereinafter also referred to as "detection signal indicating a negative AC potential difference"). The positive potential difference detection unit 521 and the negative potential difference detection unit 522 are realized by differential amplifiers (instrumentation amplifiers), for example.

Figure 4:
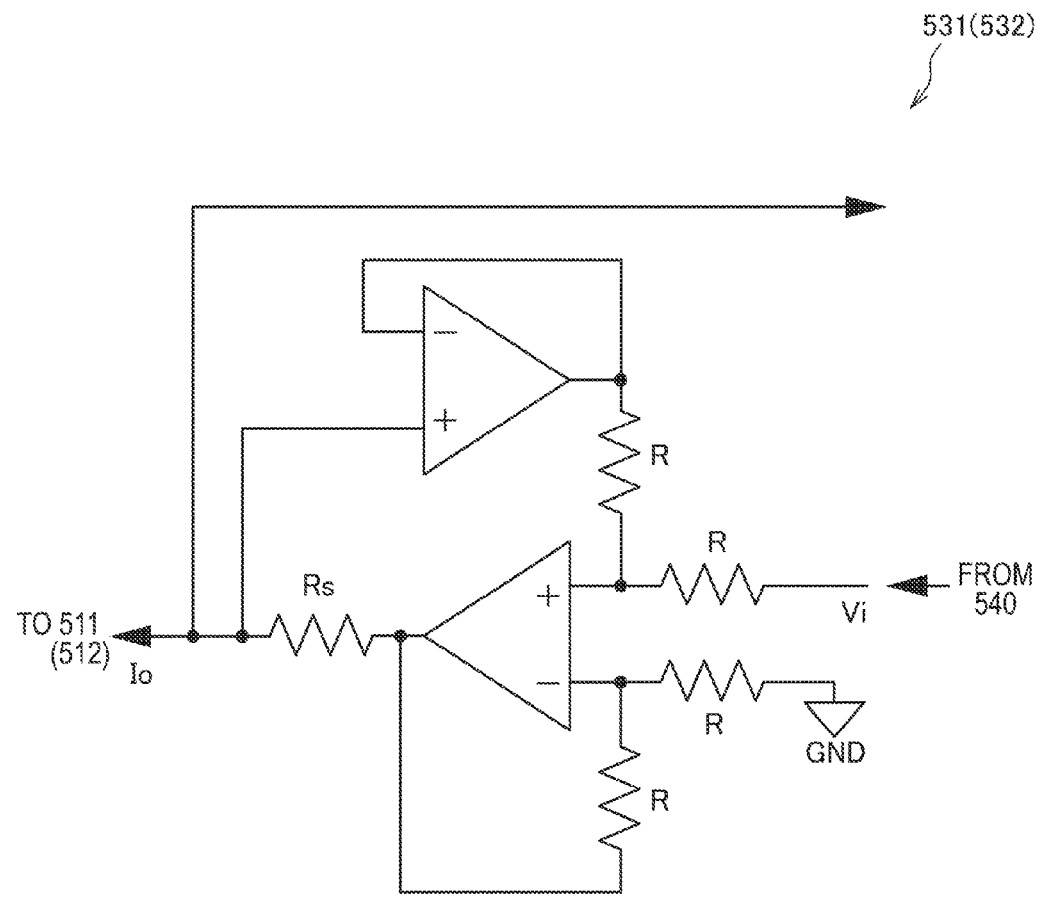
FIG. 4 shows the details of a power source unit of the impedance measuring device.

The details of the positive power source unit 531 and the negative power source unit 532 will be described later with reference to FIG. 4.

The positive power source unit 531 is a positive output unit that outputs an AC signal having a reference frequency fb. The positive power source unit 531 can be realized by, for example, a voltage/current conversion circuit such as an operational amplifier (OP amplifier). This voltage/current conversion circuit outputs current Io that is proportional to an input voltage Vi. It should be noted that the relationship Io=Vi/Rs holds, where Rs denotes a current-sensing resistance. This voltage/current conversion circuit is a variable AC source that can adjust the output current Io in accordance with the input voltage Vi.

With the use of the voltage/current conversion circuit, the output current Io can be obtained by dividing the input voltage Vi by a proportionality constant Rs without actually measuring the output current Io. The negative power source unit 532 is configured in a similar manner. That is to say, the negative power source unit 532 is a negative output unit that outputs the AC signal having the reference frequency fb.

Figure 5:
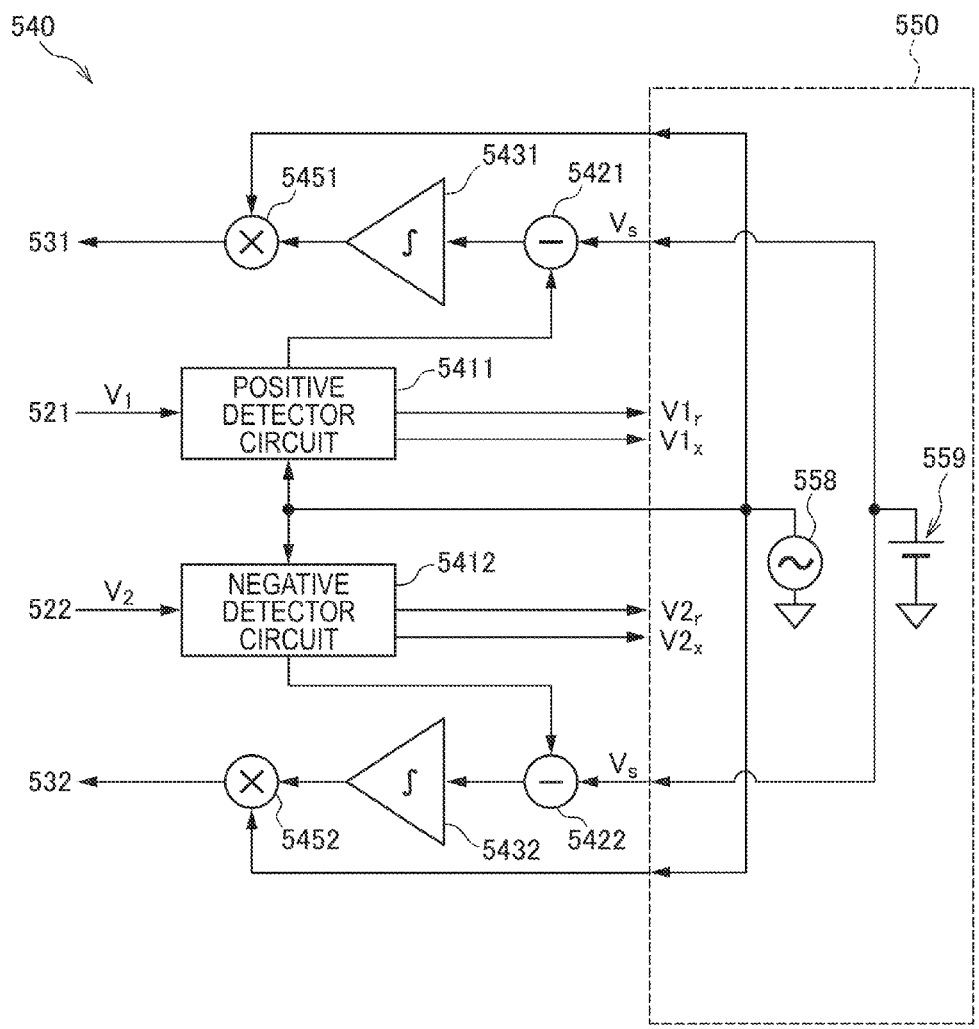
FIG. 5 shows the details of an AC adjustment unit of the impedance measuring device.

The details of the AC adjustment unit 540 will be described later with reference to FIG. 5.

The AC adjustment unit 540 can be realized by, for example, a PI control circuit. The AC adjustment unit 540 includes a positive detector circuit 5411, a positive subtractor 5421, a positive integration circuit 5431, a positive multiplier 5451, a negative detector circuit 5412, a negative subtractor 5422, a negative integration circuit 5432, and a negative multiplier 5452.

The AC adjustment unit 540 receives, as input, a reference AC signal having the reference frequency fb from an AC signal source 558, as well as a reference voltage Vs from a reference power source 559. The reference frequency fb is a predetermined frequency that is suitable for detection of an AC potential difference for the purpose of measuring the internal impedance of the fuel cell stack 1. The reference voltage Vs has a preset reference value so as to match the positive AC potential difference V1 with the negative AC potential difference V2. Although the AC signal source 558 and the reference power source 559 are provided in the resistance calculation unit 550 in the present embodiment, they may instead be provided in the AC adjustment unit 540.

The positive detector circuit 5411 detects an AC signal having the reference frequency fb so as to extract only an output signal component of the positive power source unit 531 from the detection signal from the positive potential difference detection unit 521. That is to say, the positive detector circuit 5411 generates a DC voltage signal proportional to the amplitude of the AC potential difference V1 by removing unnecessary signals from the detection signal indicating the AC potential difference V1. The positive detector circuit 5411 outputs this voltage signal to the positive subtractor 5421.

The positive subtractor 5421 detects a difference between the voltage signal from the positive detector circuit 5411 and the reference voltage Vs from the reference power source 559. As stated earlier, the reference voltage Vs has the reference value so as to match the amplitude of the detection signal indicating the positive AC potential difference with the amplitude of the detection signal indicating the negative AC potential difference.

The positive integration circuit 5431 averages a differential signal output from the positive subtractor 5421, or adjusts the sensitivity of the differential signal. The positive integration circuit 5431 then outputs the averaged differential signal to the positive multiplier 5451. The differential signal shows the amount of difference from the reference voltage Vs. For example, the larger the amount of difference, the higher the signal level of the differential signal.

The positive multiplier 5451 increases and reduces the amplitude of the AC signal output from the AC signal source 558 in accordance with the output signal from the positive integration circuit 5431. In this way, the amplitude of the AC signal output from the AC signal source 558 is adjusted so that the AC potential difference V1 equals the reference voltage Vs. Then, the positive multiplier 5451 outputs the AC signal that has been adjusted to the reference voltage Vs to the positive power source unit 531 as an amplitude instruction value.

As indicated above, with the use of the AC signal from the AC signal source 558, the AC adjustment unit 540 converts the amplitude of the detection signal indicating the AC potential difference V1 into a DC signal, extracts the DC signal, and adjusts the amplitude of the positive AC signal in accordance with the magnitude of a difference between the DC signal and the reference voltage Vs. The AC adjustment unit 540 also adjusts the amplitude of the negative AC signal in a similar manner.

The adjusted positive and negative AC signals are input to the positive power source unit 531 and the negative power source unit 532, respectively. The positive power source unit 531 and the negative power source unit 532 output currents corresponding to the voltage levels of the adjusted AC signals to the positive electrode terminal 211 and the negative electrode terminal 212, respectively.

That is to say, the AC adjustment unit 540 adjusts the amplitudes of the positive AC signal and the negative AC signal that are output from the positive power source unit 531 and the negative power source unit 532, respectively, so that the detection signal indicating the positive AC potential difference and the detection signal indicating the negative AC potential difference both converge on the reference voltage Vs.

In this way, the AC potential Va at the positive electrode terminal 211 and the AC potential Vb at the negative electrode terminal 212 are both controlled to be at a reference level, that is to say, the AC potential Va and the AC potential Vb become equal. This makes it possible to prevent leakage of an AC signal from the impedance measuring device 5 to a load 3 connected to the fuel cell stack 1. Hereinafter, control over gains of the positive power source unit 531 and the negative power source unit 532 so as to equalize the AC potential Va and the AC potential Vb will be referred to as "equipotential control".

Meanwhile, there are cases in which equipotential control does not function properly due to parasitic capacitance existing inside the fuel cell stack 1.

As shown in FIG. 2, the fuel cell stack 1 is represented by an equivalent circuit in which a positive internal resistance R1 and a negative internal resistance R2 are connected in parallel to a positive capacitance C1 and a negative capacitance C2. The inventor has discovered that the capacitances C1 and C2 change significantly due to, for example, fluctuations in the concentrations of the anode gas and the cathode gas supplied to the fuel cell stack 1.

For example, at the time of activation of the fuel cell stack 1, gas concentrations of the anode gas and the cathode gas inside the fuel cell stack increase, and the capacitances C1 and C2 change significantly with such an increase. This change in the capacitances C1 and C2 causes a significant change in the phases of the detection signals indicating the AC potential differences.

Figure 6:
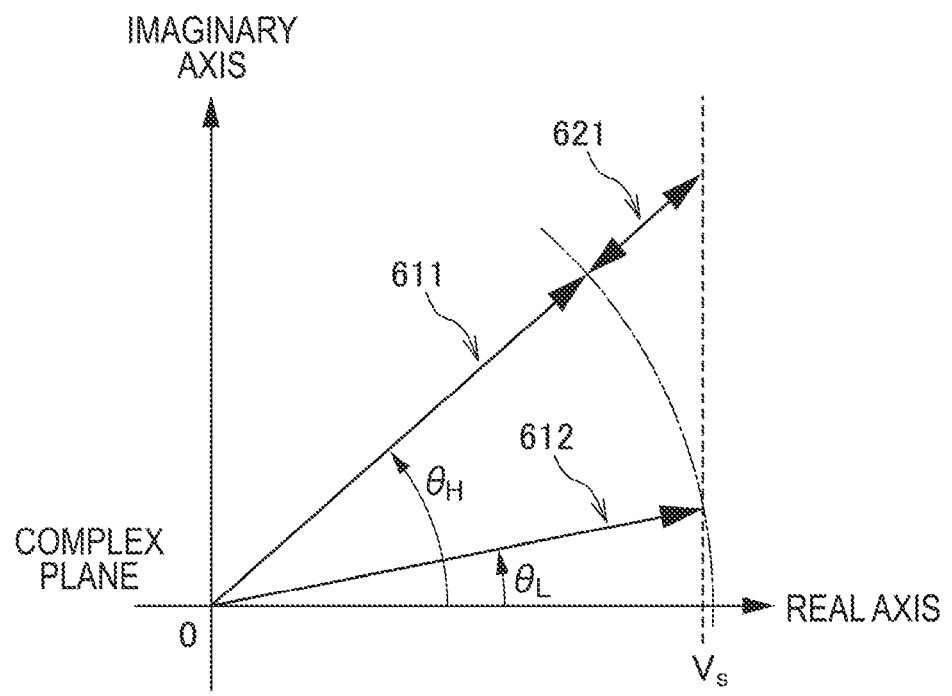
FIG. 6 shows excessive amplification of an AC signal caused by a fluctuation in parasitic capacitance of the fuel cell.

FIG. 6 is an explanatory diagram showing a phase shift between the detection signal indicating the positive AC potential difference and the detection signal indicating the negative AC potential difference. FIG. 6 shows a vector 611 of the detection signal indicating the positive AC potential difference and a vector 612 of the detection signal indicating the negative AC potential difference. A line with alternating dots and dashes in FIG. 6 indicates the amplitude of the detection signals indicating the AC potential differences. It should be noted that the horizontal axis represents real axis components of the vectors, whereas the vertical axis represents imaginary axis components of the vectors.

The vectors 611 and 612 shown in FIG. 6 have been adjusted to the reference voltage Vs in advance, and pertain to a case in which the reactance of the capacitance C1 has increased earlier than that of the capacitance C2 with the activation of the fuel cell stack 1.

In the fuel cell stack 1, the anode gas and the cathode gas flow from the positive electrode terminal 211 side to the negative electrode terminal 212 side as shown in FIGS. 1A and 1B. For this reason, the gas concentration in a positive power generation cell group composed of the positive electrode terminal 211 through to the midpoint terminal 213 increases earlier than the gas concentration in a negative power generation cell group composed of the midpoint terminal 213 through to the negative electrode terminal 212. Therefore, a change in the capacitance C1 precedes a change in the capacitance C2. Accordingly, the phase angle θH of the vector 611 increases earlier than the phase angle θL of the vector 612.

As shown in FIG. 6, the phase angle θH of the vector 611 exhibits a nearly 45-degree rotation depending on the operation state of the fuel cell stack 1. If the equipotential control is performed in this state, the amplitudes of the AC signals are adjusted so that the detection levels (effective values, peak values, or average values) of the detection signals indicating the AC potential differences match the reference voltage Vs.

For example, as ordinary positive and negative detection circuits detect only real axis components of the detection signals indicating the AC potential differences, an approximately 45-degree rotation of the phase angle θH of the vector 611 reduces the real axis component of the vector 611, which leads to a decrease in the detection signal levels.

With a decrease in the detection signal levels, a gain of the positive power source unit 531 is set to be high so that the real axis component of the vector 611 equals the reference voltage Vs. As a result, the AC signal output to the positive electrode terminal 211 is amplified to have an excess amplitude corresponding to an adjustment amount 621.

Figure 7:
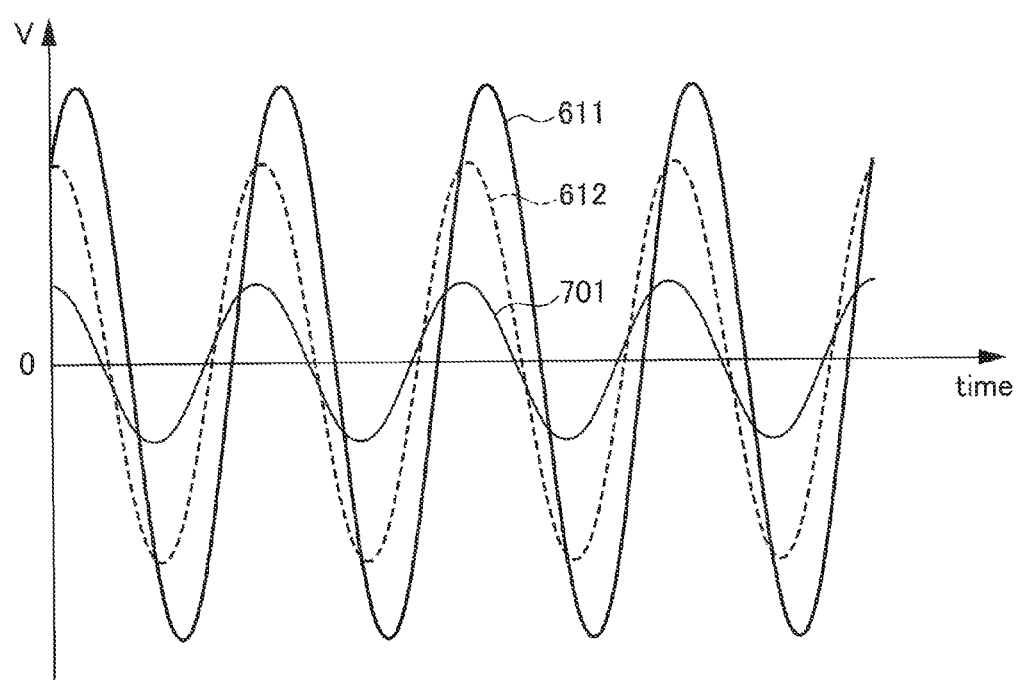
FIG. 7 shows a waveform of an AC signal that has undergone excessive amplification.

FIG. 7 shows a detection signal 611 indicating the AC potential difference to which the adjustment amount 621 has been added, in the form of an AC signal waveform. FIG. 7 also shows a detection signal 612 indicating the negative AC potential difference and a reference AC signal 701 from the AC signal source 558. The vertical axis represents a potential, whereas the horizontal axis represents time.

As shown in FIG. 7, due to the fluctuation in the capacitance C1, the phase of the detection signal 611 indicating the positive AC potential difference is delayed compared to that of the reference AC signal 701. Therefore, through the equipotential control, the amplitude value (peak value) of the detection signal 611 indicating the positive AC potential difference is controlled excessively and significantly compared to that of the detection signal 612 indicating the negative AC potential difference. As a result, the AC potential difference between the detection signal 611 indicating the positive AC potential difference and the detection signal 612 indicating the negative AC potential difference increases.

The larger the AC potential difference, the larger the amount of current leaking to the load 3 of the fuel cell stack 1. Accordingly, error between the amount of current that is output from the positive power source unit 531 and the amount of current that actually flows into the internal resistance R1 of the fuel cell stack 1 increases. This leads to a decrease in the measurement accuracy of the internal resistance R1.

As indicated above, if the equipotential control is performed in a state where the capacitance C1 or C2 has significantly fluctuated due to the operation state of the fuel cell stack 1, a problem arises in which the potential difference between the potential Va and the potential Vb rather increases and the measurement accuracy of the internal resistances decreases.

In view of the above, in the present embodiment, vector values of the detection signals indicating the AC potential differences are obtained by detecting a phase shift between the detection signals indicating the AC potential differences caused by a fluctuation in the parasitic capacitance existing inside the fuel cell stack, and the equipotential control is performed on the basis of those vector values.

In the present embodiment, in order to perform the equipotential control on the basis of the vector values of the detection signals indicating the AC potential differences, the positive detector circuit 5411 and the negative detector circuit 5412 detect real axis components and imaginary axis components of the detection signals indicating the AC potential differences.

Figure 8:
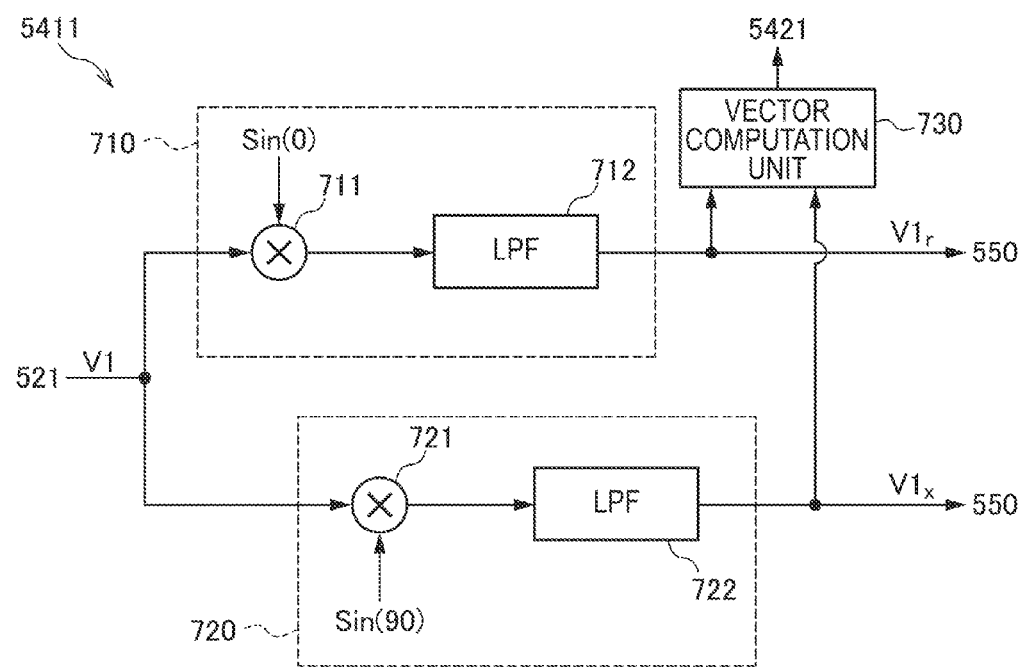
FIG. 8 shows the details of a positive detector circuit of the AC adjustment unit.

FIG. 8 shows a configuration of the positive detector circuit 5411 according to the present embodiment.

The positive detector circuit 5411 includes an in-phase component extraction unit 710, an orthogonal component extraction unit 720, and a vector computation unit 730.

The in-phase component extraction unit 710 multiplies the detection signal from the positive potential difference detection unit 521 by an in-phase signal Sin(0) for detecting the internal resistance R1, thereby extracting a real axis component V1r of the detection signal. The in-phase signal Sin(0) is an AC signal having the reference frequency fb, and is in phase with the output signal from the positive power source unit 531. For example, the in-phase signal Sin(0) is input from the AC signal source 558 to the in-phase component extraction unit 710. The in-phase component extraction unit 710 includes an in-phase multiplication unit 711 and an in-phase low-pass filter 712.

The in-phase multiplication unit 711 multiplies the positive AC potential difference V1 by the in-phase signal Sin(0). Consequently, the in-phase multiplication unit 711 outputs an in-phase AC signal corresponding to a degree of match between the waveform of the AC potential difference V1 and the waveform of the in-phase signal Sin(0). For example, when the AC potential difference V1 and the in-phase signal Sin(0) completely match in phase, the in-phase multiplication unit 711 outputs an in-phase AC signal having a full-wave rectified waveform. Furthermore, the higher the degree of match between the waveform of the AC potential difference V1 and the waveform of the in-phase signal Sin(0), the larger the real axis component V1r of the detection signal indicating the AC potential difference.

The in-phase low-pass filter 712 detects the DC component V1r of the in-phase AC signal. That is to say, the in-phase low-pass filter 712 removes an AC component or a high-frequency domain component of the in-phase AC signal while allowing a DC component of the in-phase AC signal to pass therethrough. The in-phase AC signal smoothed by the in-phase low-pass filter 712 is input to the vector computation unit 730 as the real axis component V1r of the detection signal indicating the AC potential difference.

As indicated above, the in-phase component extraction unit 710 extracts, from the detection signal indicating the AC potential difference, only the real axis component V1r having the same frequency as the in-phase signal Sin(0), which is in phase with the output AC signal from the positive power source unit 531, by multiplying the AC potential difference Vi by the in-phase signal Sin(0). Therefore, even if the AC potential difference signal is covered with noise, the in-phase component extraction unit 710 can reliably detect the real axis component V1r.

Furthermore, the in-phase component extraction unit 710 outputs the real axis component V1r of the detection signal indicating the positive AC potential difference to the resistance calculation unit 550. The resistance calculation unit 550 computes the internal resistance R1 of the fuel cell stack 1 on the basis of the positive real axis component V1r and an output signal I1 from the positive power source unit 531. In this way, the internal resistance R1 is obtained from the real axis component V1r of the detection signal indicating the AC potential difference. Hence, the real axis component V1r can be called a resistance component of the detection signal indicating the AC potential difference.

The orthogonal component extraction unit 720 multiplies the detection signal from the positive potential difference detection unit 521 by an orthogonal signal Sin(90) for detecting the capacitance C2, thereby extracting an imaginary axis component V1x of the detection signal. The orthogonal signal Sin(90) is an AC signal having the reference frequency fb, and the phase angle thereof is orthogonal to that of the output signal from the positive power source unit 531. The orthogonal signal Sin(90) has the same amplitude as the in-phase signal. For example, the phase of the AC signal source 558 is rotated by 90 degrees, and the result of the rotation is input to the orthogonal component extraction unit 720 as the orthogonal signal Sin(90). The orthogonal component extraction unit 720 includes an orthogonal multiplication unit 721 and an orthogonal low-pass filter 722.

The orthogonal multiplication unit 721 multiplies the AC potential difference V1 by the orthogonal signal Sin(90). Consequently, the orthogonal multiplication unit 721 outputs an orthogonal AC signal corresponding to a degree of match between the waveform of the AC potential difference V1 and the waveform of the orthogonal signal.

The orthogonal low-pass filter 722 detects the DC component V1x of the orthogonal AC signal. That is to say, the orthogonal low-pass filter 722 removes an AC component or a high-frequency domain component of the orthogonal AC signal while allowing a DC component of the orthogonal AC signal to pass therethrough. The orthogonal AC signal smoothed by the orthogonal low-pass filter 722 is input to the vector computation unit 730 as the imaginary axis component V1x of the detection signal indicating the AC potential difference.

As indicated above, the orthogonal component extraction unit 720 extracts, from the detection signal indicating the AC potential difference, only the imaginary axis component V1x having the same frequency as the orthogonal signal Sin(90) by multiplying the AC potential difference V1 by the orthogonal signal Sin(90). Therefore, even if the detection signal indicating the AC potential difference is covered with noise, the orthogonal component extraction unit 720 can reliably detect the imaginary axis component V1x.

The vector computation unit 730 calculates a vector value Vp1 of the detection signal indicating the AC potential difference on the basis of the real axis component V1r and the imaginary axis component V1x. Specifically, the vector computation unit 730 obtains the vector value Vp1 by computing a square root of the sum of the square of the real axis component V1r and the square of the imaginary axis component V1x in accordance with the following expression.

$$Vp1 = \sqrt{V1r^2 \times V1x^2} \quad \text{[Math 1]}$$

The vector computation unit 730 outputs the vector value Vp1 of the detection signal indicating the AC potential difference to the positive subtractor 5421 as a detection signal for adjusting the amplitude of an AC signal.

As indicated above, the positive detector circuit 5411 detects both the real axis component V1r and the imaginary axis component V1x of the detection signal indicating the AC potential difference. The positive detector circuit 5411 then reproduces the vector value Vp1 of the detection signal indicating the AC potential difference and outputs the vector value Vp1 to the positive subtractor 5421. It should be noted that the negative detector circuit 5412 is configured similarly to the positive detector circuit 5411.

The orthogonal component extraction unit 720 may also output the imaginary axis component V1x of the detection signal indicating the AC potential difference to the resistance calculation unit 550. In this case, the resistance calculation unit 550 can compute the capacitance C1 on the basis of the imaginary axis component V1x of the detection signal. In this way, the capacitance C1 is obtained from the imaginary axis component V1x of the detection signal. Hence, the imaginary axis component V1x can be called a capacitance component of the detection signal indicating the AC potential difference.

Figure 9:
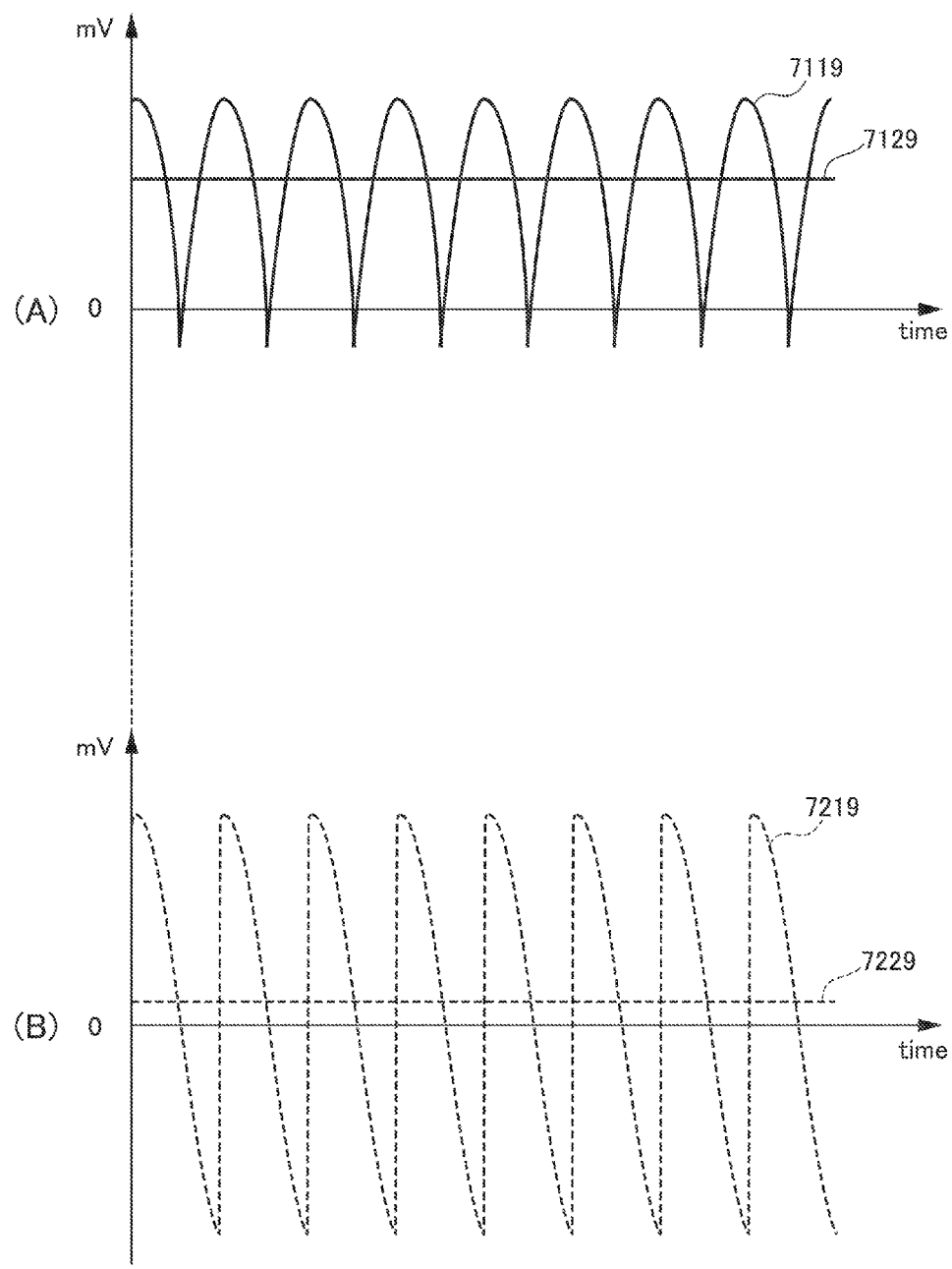
FIGS. 9A and 9B show detection signals showing a real axis component and an imaginary axis component of an AC potential difference signal.

FIGS. 9A and 9B show examples of signal components extracted from the detection signal indicating the AC potential difference. FIG. 9A shows the real axis component detected by the in-phase component extraction unit 710, i.e., the real axis component of the detection signal indicating the AC potential difference. Specifically, FIG. 9A shows an in-phase AC signal 7119 that is extracted by the in-phase multiplication unit 711, and a detection signal 7129 that is detected by the in-phase low-pass filter 712 as the real axis component.

FIG. 9B shows the imaginary axis component detected by the orthogonal component extraction unit 720. Specifically, FIG. 9B shows an orthogonal AC signal 7219 that is extracted by the orthogonal multiplication unit 721, and a detection signal 7229 that is detected by the orthogonal low-pass filter 722 as the imaginary axis component.

In FIG. 9A, the in-phase AC signal 7119 approximates a full-wave rectified waveform because a degree of match between the waveform of the AC potential difference V1 and the waveform of the in-phase signal Sin(0) is high. The detection signal 7129 representing the real axis component has a higher signal level than the detection signal 7229 representing the imaginary axis component shown in FIG. 9B.

The larger the rotation of the phase angle caused by a fluctuation in the capacitance C1, the lower the level of the detection signal 7129 representing the real axis component, and the higher the level of the detection signal 7229 representing the imaginary axis component. It is hence apparent in the shown examples that the rotation of the phase angle caused by a fluctuation in the capacitance C1 is small.

Figure 10:
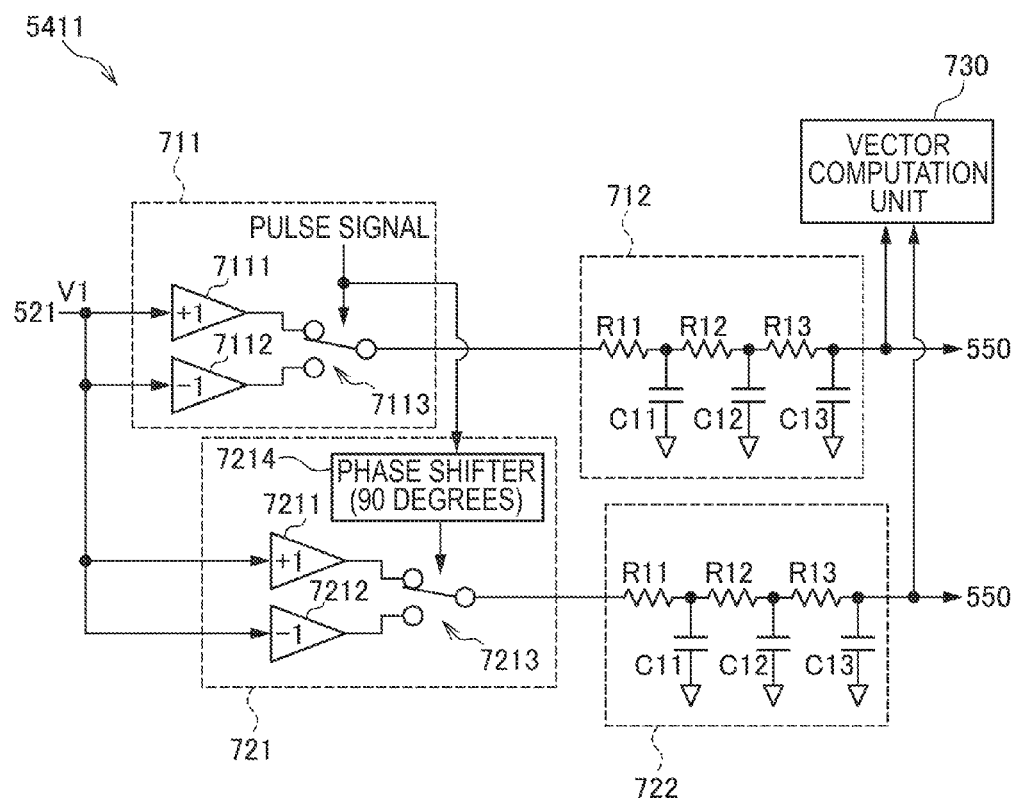
FIG. 10 shows the details of the positive detector circuit.

FIG. 10 shows a specific example of the positive detector circuit 5411 shown in FIG. 8.

The in-phase multiplication unit 711 includes a non-inverting multiplier 7111, an inverting multiplier 7112, and an in-phase switch 7113.

The non-inverting multiplier 7111 multiplies the AC potential difference V1 by a positive (plus) constant "+1". Consequently, there is no sign inversion in the detection signal (positive AC signal) output therefrom.

The inverting multiplier 7112 multiplies the AC potential difference V1 by a negative (minus) constant "−1". Consequently, there is sign inversion in the detection signal (negative AC signal) output therefrom. The non-inverting multiplier 7111 and the inverting multiplier 7112 are realized by operational amplifiers.

The in-phase switch 7113 switches between connection to an output terminal of the non-inverting multiplier 7111 and connection to an output terminal of the inverting multiplier 7112 in accordance with a rectangular pulse signal having the reference frequency fb. In this way, the real axis component of the detection signal indicating the AC potential difference V1 is full-wave rectified.

Specifically, the rectangular pulse signal, which is in synchronization with the AC signal from the AC signal source 558, is input to a control terminal of the in-phase switch 7113. In accordance with the rectangular pulse signal having the reference frequency fb, the in-phase switch 7113 connects either one of an output terminal of the non-inverting multiplier 7111 and an output terminal of the inverting multiplier 7112 to an input terminal of the in-phase low-pass filter 712.

For example, when the rectangular pulse signal having the reference frequency fb is at a high (H) level, the in-phase switch 7113 connects the output terminal of the non-inverting multiplier 7111 to the input terminal of the in-phase low-pass filter 712. On the other hand, when the rectangular pulse signal is at a low (L) level, the in-phase switch 7113 connects the output terminal of the inverting multiplier 7112 to the input terminal of the in-phase low-pass filter 712. In this way, the in-phase AC signal that has been full-wave rectified using the positive AC signal and the negative AC signal is input to the in-phase low-pass filter 712.

The in-phase low-pass filter 712 includes resistive elements R11, R12, R13, and capacitive elements C11, C12, C13. An output terminal of the in-phase multiplication unit 711 and one end of the resistive element R11 are connected. The other end of the resistive element R11 is connected to one end of the capacitive element C11. The other end of the capacitive element C11 is earthed. In the in-phase low-pass filter 712, three RC circuits configured in the foregoing manner are connected in series. The in-phase low-pass filter 712 rectifies the in-phase AC signal and inputs the rectified in-phase AC signal to the vector computation unit 730 as the real axis component V1r of the detection signal. It should be noted that the orthogonal low-pass filter 722 is configured similarly to the in-phase low-pass filter 712.

The orthogonal multiplication unit 721 includes a non-inverting multiplier 7211, an inverting multiplier 7212, an orthogonal switch 7213, and a phase shifter 7214.

The non-inverting multiplier 7211 multiplies the AC potential difference V1 by a positive constant "+1". Consequently, there is no sign inversion in the detection signal (positive AC signal) output therefrom.

The inverting multiplier 7212 multiplies the AC potential difference V1 by a negative constant "−1". Consequently, there is sign inversion in the detection signal (negative AC signal) output therefrom. The non-inverting multiplier 7121 and the inverting multiplier 7122 are realized by operational amplifiers.

The phase shifter 7214 changes the phase of the rectangular pulse signal input to the control terminal of the in-phase switch 7113 by 90 degrees. The phase shifter 7214 outputs the rectangular pulse signal that has been subjected to the 90-degree phase shift to a control terminal of the orthogonal switch 7213 as an orthogonal pulse signal.

The orthogonal switch 7213 switches between an output signal from the non-inverting multiplier 7211 and an output signal from the inverting multiplier 7212 in accordance with the orthogonal pulse signal having the reference frequency fb. Consequently, the orthogonal switch 7213 outputs the orthogonal AC signal. The orthogonal low-pass filter 722 rectifies the orthogonal AC signal and inputs the rectified orthogonal AC signal to the vector computation unit 730 as the imaginary axis component V1x.

Figure 11:
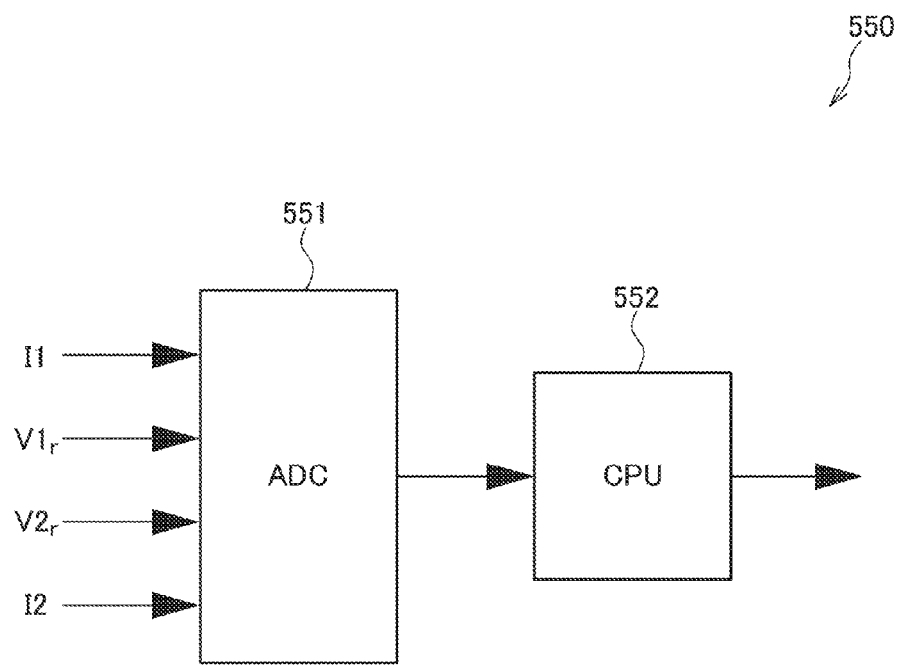
FIG. 11 shows the details of a resistance calculation unit of the impedance measuring device.

The details of the resistance calculation unit 550 will be described with reference to FIG. 11.

The resistance calculation unit 550 computes the positive internal resistance R1 of the fuel cell stack 1 on the basis of a voltage value of the real axis component V1r of the detection signal and a current value of the AC signal from the positive power source unit 531. That is to say, the resistance calculation unit 550 calculates the positive real axis impedance on the basis of the resistance component V1r of the positive detection signal and the output signal I1 from the positive power source unit 531. It should be noted that the positive real axis impedance denotes the positive internal resistance R1. The resistance calculation unit 550 includes an AD converter 551 and a microcomputer chip 552.

The AD converter 551 converts alternating currents (I1, I2) and AC voltages (V1r, V2r), which are analog signals, into digital numerical signals, and then transfers the digital numerical signals to the microcomputer chip 552.

A program for calculating the internal resistances Rn, as well as the overall internal resistance R of the stacked battery, is prestored in the microcomputer chip 552. The microcomputer chip 552 sequentially performs computation at a predetermined minute time interval, or outputs the computation results in response to a request from a controller. The internal resistances Rn, as well as the overall internal resistance R of the stacked battery, are computed using the following expressions.

[Math 2]

Expression for computing resistances $$Rn = \frac{Vn}{In} (n = 1, 2, \ldots, n) \quad (1\text{-}1)$$

Overall resistance value $$R = \Sigma Rn \quad (1\text{-}2)$$

The resistance calculation unit 550 may be realized by an analog computation circuit using an analog computation IC. The analog computation circuit can output temporally continuous changes in resistance values.

Figure 12:
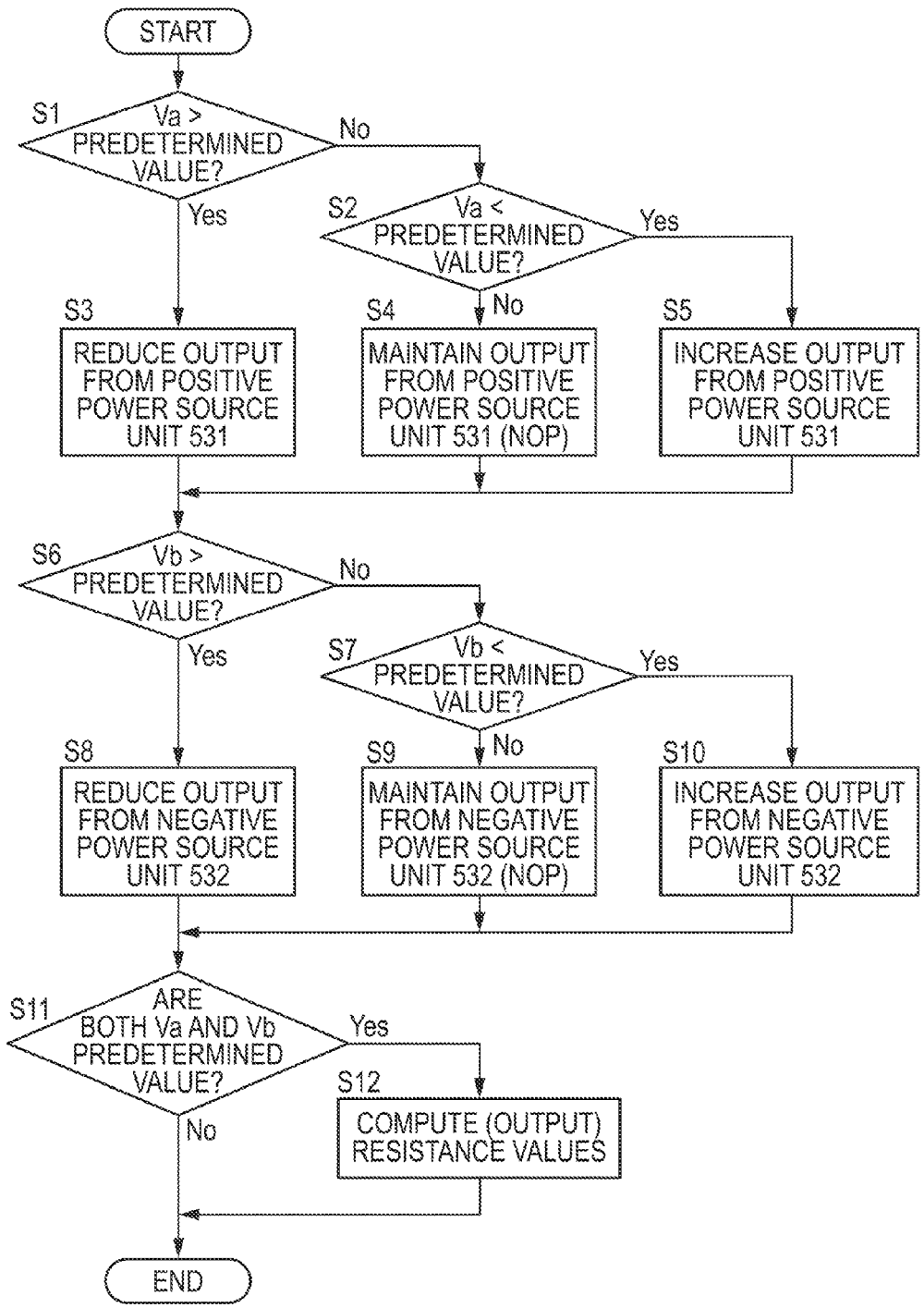
FIG. 12 is a flowchart showing a method of equipotential control performed by the impedance measuring device.

FIG. 12 is a flowchart showing a control method used by a controller of the impedance measuring device 5.

In step S1, the controller determines whether the positive AC potential Va is higher than a predetermined value. If the controller determines negatively, processing proceeds to step S2. If the controller determines affirmatively, processing proceeds to step S3.

In step S2, the controller determines whether the positive AC potential Va is lower than the predetermined value. If the controller determines negatively, processing proceeds to step S4. If the controller determines affirmatively, processing proceeds to step S5.

In step S3, the controller reduces the output from the positive power source unit 531. Consequently, the positive AC potential Va decreases.

In step S4, the controller maintains the output from the positive power source unit 531. Consequently, the positive AC potential Va is maintained.

In step S5, the controller increases the output from the positive power source unit 531. Consequently, the positive AC potential Va increases.

In step S6, the controller determines whether the negative AC potential Vb is higher than the predetermined value. If the controller determines negatively, processing proceeds to step S7. If the controller determines affirmatively, processing proceeds to step S8.

In step S7, the controller determines whether the negative AC potential Vb is lower than the predetermined value. If the controller determines negatively, processing proceeds to step S9. If the controller determines affirmatively, processing proceeds to step S10.

In step S8, the controller reduces the output from the negative power source unit 532. Consequently, the negative AC potential Vb decreases.

In step S9, the controller maintains the output from the negative power source unit 532. Consequently, the negative AC potential Vb is maintained.

In step S10, the controller increases the output from the negative power source unit 532. Consequently, the negative AC potential Vb increases.

In step S11, the controller determines whether the positive AC potential Va and the negative AC potential Vb are the predetermined value (reference voltage Vs). If the controller determines affirmatively, processing proceeds to step S12. If the controller determines negatively, processing is ended.

In step S12, the controller computes resistance values on the basis of the aforementioned expressions (1-1) and (1-2).

Figure 13:
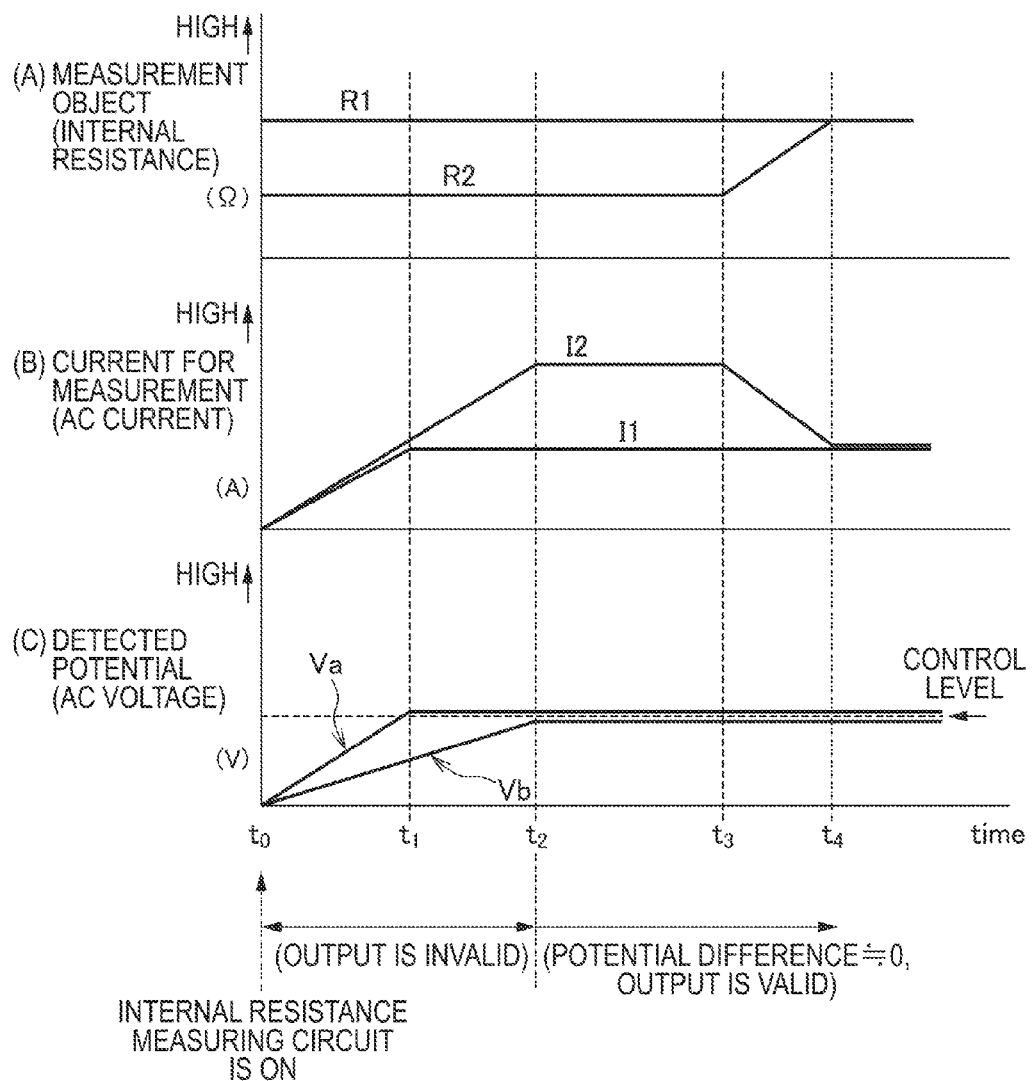
FIGS. 13A to 13C depict a time chart documenting execution of the equipotential control.

FIGS. 13A to 13C depict a time chart illustrating the control method used by the controller of the impedance measuring device 5. Step numbers will accompany the following description so as to clarify correspondence with the flowchart.

Referring to FIGS. 13A to 13C, initially, the positive internal resistance value R1 is large, and the negative internal resistance value R2 is small (FIG. 13A). The controller starts the control in this state.

At time t0, neither the positive AC potential Va nor the negative AC potential Vb has reached a control level (FIG. 13C). In this state, the controller repeats steps S1→S2→S5→S6→S7→S10→S11. Consequently, the positive alternating current I1 and the negative alternating current I2 increase (FIG. 13B).

When the positive AC potential Va reaches the control level at time t1 (FIG. 13C), the controller repeats steps S1→S2→S4→S6→S7→S10→S11. Consequently, the positive alternating current I1 is maintained, and the negative alternating current I2 increases (FIG. 13B).

When the negative AC potential Vb also reaches the control level, i.e., the same level as the positive AC potential Va at time t2 (FIG. 13C), the controller executes the processes of steps S1→S2→S4 S6→S7→S9→S11→S12. Consequently, the positive alternating current I1 and the negative alternating current I2 are maintained. Then, the positive internal resistance value R1 and the negative internal resistance value R2 are computed on the basis of the expression (1-1). The overall internal resistance R is obtained by adding the positive internal resistance value R1 and the negative internal resistance value R2.

At time t3 onward, the negative internal resistance value R2 increases due to, for example, a change in the moisture state of the fuel cell stack 1 (FIG. 13A). In this case, the controller repeats steps S1→S2→S4→S6→S8→S11→S12. Through these processes, the negative alternating current I2 decreases as the negative internal resistance value R2 increases. Consequently, the negative AC potential is maintained at the same level as the positive AC potential. Hence, the internal resistance is computed in this state as well.

At time t4 onward, the negative internal resistance value matches the positive internal resistance value (FIG. 13A). In this case, the controller repeats steps S1→S2→S4→S6→S7→S9→S11→S12. Through these processes, the positive AC potential and the negative AC potential are maintained at the same level (FIG. 13C), and the internal resistance is computed.

A description is now given of the operational effects achieved by the equipotential control performed by the impedance measuring device 5.

While the fuel cell stack 1 (stacked battery) is performing output, the potential difference between the positive electrode terminal 211 and the negative electrode terminal 212 is equal to a DC voltage being supplied to the load. In the present embodiment, the positive power source unit 531 and the negative power source unit 532 output alternating currents with adjusted amplitudes in response to an instruction from the AC adjustment unit 540.

The alternating current output from the positive power source unit 531 is output to a positive electrode of the fuel cell stack 1 via the positive DC interruption unit 511, and flows into the positive potential difference detection unit 521 via the midpoint terminal 213 and the midpoint DC interruption unit 513. At this time, the AC potential difference V1 (V1=Va−Vc) occurs between the positive electrode terminal 211 and the midpoint terminal 213 due to the internal resistance and supplied current. This AC potential difference V1 is detected by the positive potential difference detection unit 521.

On the other hand, the alternating current output from the negative power source unit 532 is output to a negative electrode of the fuel cell stack 1 via the negative DC interruption unit 512, and flows into the negative potential difference detection unit 522 via the midpoint terminal 213 and the midpoint DC interruption unit 513. At this time, the AC potential difference V2 (V2=Vb−Vc) occurs between the negative electrode terminal 212 and the midpoint terminal 213 due to the internal resistance and supplied current. This AC potential difference V2 is detected by the negative potential difference detection unit 522.

The AC adjustment unit 540 applies vector decomposition to the detection signal detected by the positive potential difference detection unit 521, i.e., decomposes the detection signal into the real axis component V1r and the imaginary axis component V1x. Then, the AC adjustment unit 540 computes the amplitude value, i.e., the vector value Vp1 of the positive detection signal on the basis of the real axis component V1r and the imaginary axis component V1x.

Similarly, the AC adjustment unit 540 applies vector decomposition to the detection signal detected by the negative potential difference detection unit 522, i.e., decomposes the detection signal into the real axis component V2r and the imaginary axis component V2x. Then, the AC adjustment unit 540 calculates the negative vector value Vp2 on the basis of the real axis component V2r and the imaginary axis component V2x.

The AC adjustment unit 540 adjusts the positive power source unit 531 and the negative power source unit 532 so that the difference between the positive vector value Vp1 and the negative vector value Vp2 of the fuel cell stack 1 (Vp1−Vp2) is always small.

Even if the positive or negative detection signal undergoes a phase shift due to a fluctuation in the capacitance C1 or C2, the phase shift does not change the vector value of the detection signal. Therefore, by performing the equipotential control using both vector values, it is possible to precisely match the AC potential difference V1 and the AC potential difference V2 with each other.

Figure 14:
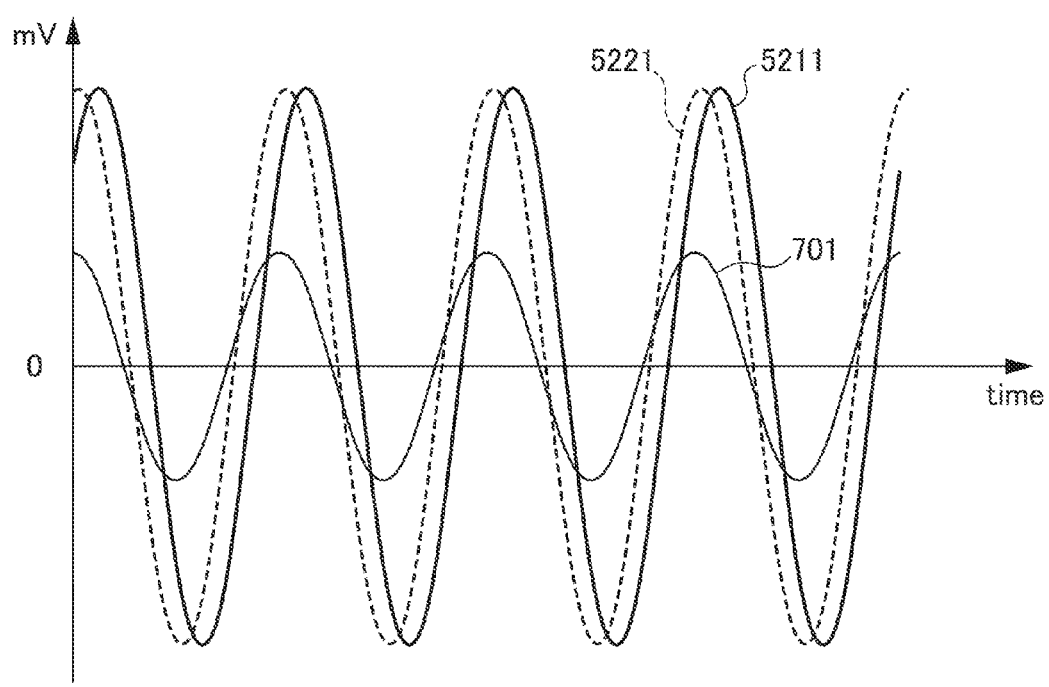
FIG. 14 shows waveforms of AC signals that have been subjected to the equipotential control using vector values of detection signals.

FIG. 14 shows a positive detection signal 5211 and a negative detection signal 5221 obtained as a result of adjustment through the equipotential control. The positive detection signal 5211 represents an AC potential difference between the positive electrode terminal 211 and the midpoint terminal 213 after the AC adjustment unit 540 has adjusted the amplitude of the positive power source unit 531. The negative detection signal 5221 represents an AC potential difference between the negative electrode terminal 212 and the midpoint terminal 213 after the AC adjustment unit 540 has adjusted the amplitude of the negative power source unit 532.

As shown in FIG. 14, by using vector values of the AC potential difference detection signals, the maximum amplitude values of the detection signals can always be detected with accuracy, even if the positive detection signal 5211 is delayed compared to the negative detection signal 5221 due to a fluctuation in the capacitance C1. It is hence possible to match the amplitude of the positive AC signal and the amplitude of the negative AC signal with each other.

In a state where the amplitudes of the AC signals match each other, the AC adjustment unit 540 acquires the real axis component V1r of the positive detection signal, the real axis component V2r of the negative detection signal, the alternating current I1 of the positive power source unit 531, and the alternating current I2 of the negative power source unit 532, and outputs them to the resistance calculation unit 550. The resistance calculation unit 550 calculates the positive internal resistance R1 and the negative internal resistance R2 of the fuel cell stack 1 by applying Ohm's law to the positive real axis component V1r, the positive alternating current I1, the negative real axis component V2r, and the negative alternating current I2.

By thus performing the equipotential control using vector values as detection values of the AC potential differences, the AC potentials at the positive electrode terminal 211 and the negative electrode terminal 212 can be controlled to be equal regardless of a fluctuation in the parasitic capacitance of the fuel cell stack 1. Therefore, even if a load device (e.g., a motor for driving) is connected to the positive electrode terminal 211 and the negative electrode terminal 212, it is possible to suppress leakage of an alternating current to the load device.

Although current does leak to the load 3 of the fuel cell stack 1 to a certain degree due to a phase difference between the positive detection signal 5211 and the negative detection signal 5221, such leakage has a small influence on the measurement accuracy of the internal resistance R1 and the internal resistance R2 because the amount of current leaking to the load 3 due to the phase difference between the detection signals is minute compared to the amount of leakage caused by the amplitude difference shown in FIG. 6.

Therefore, by using the vector values of the detection signals, the values of alternating currents flowing into the measurement object of the internal resistances (fuel cell) substantially match the values of alternating currents output from the power sources. This makes it possible to accurately obtain the internal resistance value R1 and the internal resistance value R2 of the stacked battery using the alternating current values of the power sources. Also, the overall internal resistance value R of the fuel cell stack 1 can be measured accurately on the basis of the internal resistance value R1 and the internal resistance value R2 of the stacked battery in operation without being influenced by the state of the load device. Furthermore, as the power source units are used, the internal resistance R can be measured even during suspension of the fuel cell stack 1.

In the first embodiment of the present invention, the in-phase component extraction unit 710 multiplies the detection signal indicating the AC potential difference V1 by the in-phase signal that is in phase with the AC signal having the reference frequency fb, thereby extracting the resistance component V1r of the detection signal. Similarly, the orthogonal component extraction unit 720 multiplies the detection signal indicating the AC potential difference V1 by the orthogonal signal whose phase is orthogonal to the phase of the in-phase signal, thereby extracting the capacitance component V1x of the detection signal. Then, the vector computation unit 730 reproduces the vector value Vp1 of the detection signal on the basis of the capacitance component V1x and the resistance component V1r, and adjusts the amplitude of the AC signal output from the positive power source unit 531 so that the vector value Vp1 has a predetermined value.

In this way, even if the capacitance component C1 and the resistance component R1 of the fuel cell stack 1 have fluctuated, the amplitudes of the positive and negative AC signals can be adjusted so that the AC potential difference V1 and the AC potential difference V2 have the same amplitude.

For example, in a case where the parasitic capacitance existing in the fuel cell stack 1 has fluctuated due to the operation state of a fuel cell system, the detection signals become out of phase with the fluctuation in the parasitic capacitance, and the detection levels of the real axis components decrease. Even in this case, the maximum amplitudes of the detection signals can be identified accurately by obtaining the vector values through detection of not only the real axis components but also the imaginary axis components of the detection signals. Therefore, even if the detection levels of the real axis components of the detection signals have decreased due to the fluctuation in the capacitance, the vector values do not change, and it is hence possible to prevent an excessive increase in the amplitudes of the AC signals in the equipotential control.

Furthermore, as the adjustment accuracy of the equipotential control can be increased by using the vector values, the amount of current leaking from the impedance measuring device 5 to the load 3 of the fuel cell stack 1 can be reduced. Therefore, even if the positive detection signal and the negative detection signal have become out of phase due to the fluctuations in the capacitances C1 and C2, a decrease in the measurement accuracy of the real axis impedance can be suppressed.

Furthermore, in the present embodiment, the in-phase multiplication unit 711 multiplies the detection signal indicating the AC potential difference V1 by the in-phase signal, thereby outputting the in-phase AC signal. The in-phase low-pass filter 712 then removes a high-frequency domain component of the in-phase AC signal while allowing the real axis component of the detection signal to pass therethrough. On the other hand, the orthogonal multiplication unit 121 multiplies the detection signal indicating the AC potential difference V1 by the orthogonal signal, thereby outputting the orthogonal AC signal. The orthogonal low-pass filter 722 then removes a high-frequency domain component of the orthogonal AC signal while allowing the imaginary axis component of the detection signal to pass therethrough.

In this way, the resistance calculation unit 550 can calculate the internal resistance of the fuel cell stack 1 using the DC component of the in-phase AC signal, as well as the parasitic capacitance of the fuel cell stack 1 using the DC component of the orthogonal AC signal.

Furthermore, in the present embodiment, the in-phase multiplication unit 711 includes the non-inverting multiplier 7111 that multiplies the AC potential difference V1 by a positive constant and outputs a positive AC signal, the inverting multiplier 7112 that multiplies the AC potential difference by a negative constant and outputs a negative AC signal, and the in-phase switch 7113. The orthogonal multiplication unit 721 includes the non-inverting multiplier 7211 that multiplies the AC potential difference by a positive constant and outputs a positive AC signal, the inverting multiplier 7212 that multiplies the AC potential difference by a negative constant and outputs a negative AC signal, and the orthogonal switch 7213.

The in-phase switch 7113 switches between an output signal from the non-inverting multiplier 7111 and an output signal from the inverting multiplier 7112 in accordance with the rectangular pulse signal having the reference frequency fb. Similarly, the orthogonal switch 1213 switches between an output signal from the non-inverting multiplier 7211 and an output signal from the inverting multiplier 7212 in accordance with the orthogonal pulse signal whose phase is orthogonal to the phase of the rectangular pulse signal.

In this way, the in-phase multiplication unit 711 alternately outputs the positive AC signal and the negative AC signal in synchronization with the rectangular pulse signal, thereby generating the in-phase AC signal. The in-phase low-pass filter 712 rectifies this in-phase AC signal and extracts the real axis component of the detection signal. Similarly, the orthogonal multiplication unit 721 alternately outputs the positive AC signal and the negative AC signal in synchronization with the orthogonal pulse signal, thereby generating the orthogonal AC signal. The orthogonal low-pass filter 722 rectifies this orthogonal AC signal and extracts the imaginary axis component of the detection signal.

In this way, the positive detector circuit 5411 and the negative detector circuit 5412 can detect both the real axis components and the imaginary axis components of the detection signals.

Second Embodiment

Figure 15:
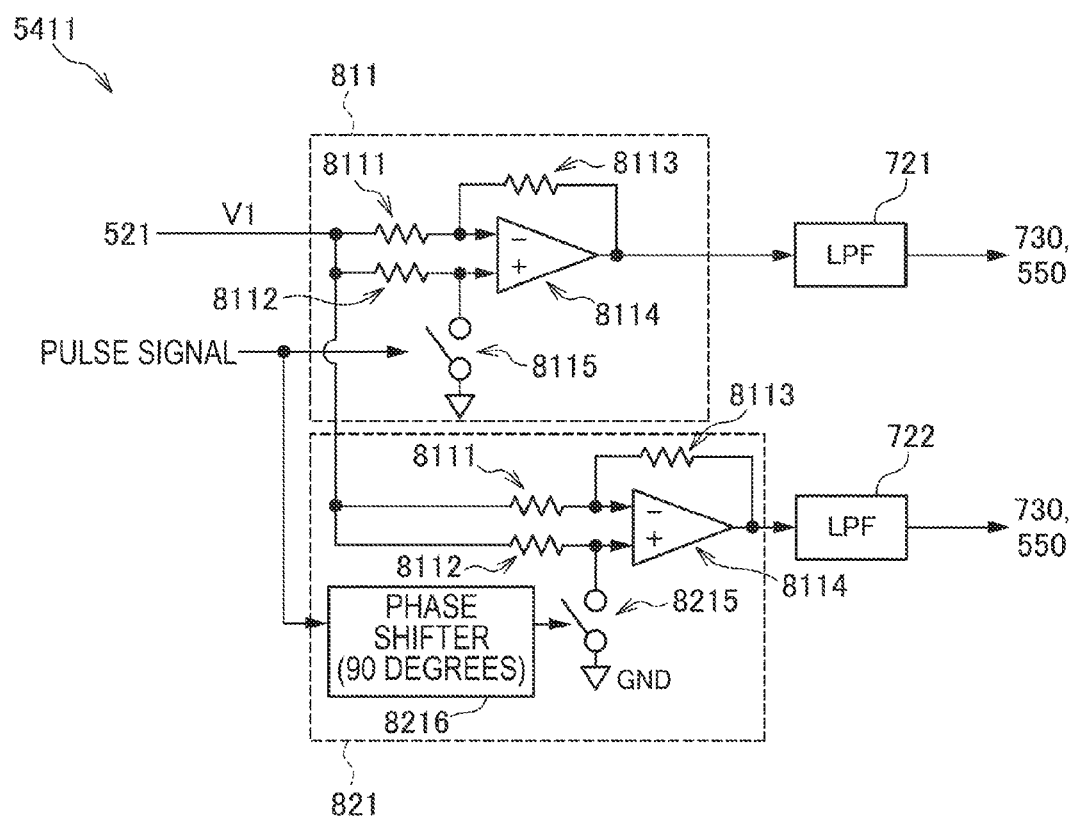
FIG. 15 shows a positive detector circuit according to a second embodiment of the present invention.

FIG. 15 is a circuit diagram showing the positive detector circuit and the negative detector circuit according to a second embodiment of the present invention. In the present embodiment, the positive detector circuit 5411 and the negative detector circuit 5412 are configured in a similar manner, and therefore only the positive detector circuit 5411 will be explained. The positive detector circuit 5411 includes an in-phase multiplication unit 811 and an orthogonal multiplication unit 821 in place of the in-phase multiplication unit 711 and the orthogonal multiplication unit 721 shown in FIG. 10. As other constituents are configured similarly to their counterparts in the first embodiment, they are given the same reference numerals and a description thereof is omitted.

The in-phase multiplication unit 811 includes resistive elements 8111, 8112, 8113, an operational amplifier 8114, and a switch 8115.

The resistive elements 8111 and 8112 are provided to adjust the amount of current from the positive potential difference detection unit 521. The resistive element 8113 is provided to adjust the amplification ratio of the operational amplifier 8114.

One end of the resistive element 8111 and one end of the resistive element 8112 are both connected to an output terminal of the positive potential difference detection unit 521. The other end of the resistive element 8111 is connected to an inverting input terminal (−) of the operational amplifier 8114 and to one end of the resistive element 8113. The other end of the resistive element 8113 is connected to an output terminal of the operational amplifier 8114. The other end of the resistive element 8112 is connected to a non-inverting input terminal (+) of the operational amplifier 8114 and to one of contact terminals of the switch 8115. The other contact terminal of the switch 8115 is earthed.

Similarly to FIG. 10, a pulse signal (rectangular waves) that is in synchronization with an AC signal from the resistance calculation unit 550 is input to a control terminal of the switch 8115. The switch 8115 switches between an earthed state and a non-earthed state of the non-inverting input terminal (+) of the operational amplifier 8114 in accordance with the pulse signal having the reference frequency fb.

For example, when a high (H)-level signal is supplied to the control terminal of the switch 8115, the switch 8115 is placed in a connected state (ON), and the non-inverting input terminal (+) of the operational amplifier 8114 is placed in the earthed state. In this state, the operational amplifier 8114 functions as an inverting amplifier that multiplies an input signal by "−1", and hence outputs an inverted voltage signal whose sign is the inverse of the sign of the detection signal.

On the other hand, when a low (L)-level signal is supplied to the control terminal of the switch 8115, the switch 8115 is placed in an interrupted state (OFF), and the non-inverting input terminal (+) of the operational amplifier 8114 is placed in the non-earthed state. In this state, the operational amplifier 8114 functions as a non-inverting amplifier that multiplies the input signal by "+1", and hence outputs a non-inverted voltage signal whose sign is not the inverse of the sign of the detection signal.

As indicated above, the non-inverting input terminal (+) of the operational amplifier 8114 is switched between the earthed state and the non-earthed state in accordance with the rectangular pulse signal that is in synchronization with the AC signal having the reference frequency fb. Consequently, the operational amplifier 8114 applies full-wave rectification to the detection signal, and the rectified in-phase AC signal is input to the vector computation unit 730 as the real axis component of the detection signal.

The orthogonal multiplication unit 821 includes resistive elements 8111, 8112, 8113 and an operational amplifier 8114, similarly to the in-phase multiplication unit 811. Therefore, a description of these constituents is omitted. The orthogonal multiplication unit 821 also includes a switch 8215 and a phase shifter 8216.

In order to extract the imaginary axis component of the detection signal, the phase shifter 8216 shifts the phase of the rectangular pulse signal input to a control terminal of the switch 8115 by 90 degrees. The phase shifter 8216 outputs the pulse signal that has been subjected to the 90-degree phase shift to a control terminal of the switch 8215 as an orthogonal pulse signal.

The switch 8215 switches between an earthed state and a non-earthed state of a non-inverting input terminal (+) of the operational amplifier 8114 in accordance with the orthogonal pulse signal having the reference frequency fb. In this way, the operational amplifier 8114 rectifies the imaginary axis component of the detection signal, and the rectified orthogonal AC signal is input to the vector computation unit 730 as the imaginary axis component of the detection signal.

Similarly to the first embodiment, the second embodiment enables detection of the real axis components and the imaginary axis components of the detection signals. Furthermore, compared to the configuration shown in FIG. 10, the number of operational amplifiers provided in the positive detector circuit 5411 and the negative detector circuit 5412 can be reduced.

Although a circuit configuration has been illustrated in the present embodiment using an analog computation IC as an example, a digital control circuit may be configured with respect to the result of digital conversion applied to the AC potential Va (Vb) in an AD converter.

Although the embodiments of the present invention have been described thus far, the foregoing embodiments merely illustrate one part of example applications of the present invention, and specific configurations of the foregoing embodiments are not intended to limit the technical scope of the present invention.

It should be noted that the foregoing embodiments can be combined as appropriate.

The present application claims a priority of Japanese Patent Application No. 2013-49416 filed with the Japan Patent Office on Mar. 12, 2013, all the contents of which are hereby incorporated by reference.

The invention claimed is:

1. An impedance measuring device, comprising:
a fuel cell having a plurality of stacked battery cells, a capacitance component, and a resistance component, the capacitance component and the resistance component changing in accordance with a state of the battery cells;
a positive output unit configured to be connected to a positive electrode terminal of the fuel cell, the positive output unit outputting an AC signal having a predetermined frequency for measuring an internal impedance of the fuel cell;
a negative output unit configured to be connected to a negative electrode terminal of the fuel cell, the negative output unit outputting the AC signal having the predetermined frequency;
a detection unit configured to detect an AC potential difference between the positive electrode terminal and a midpoint of the fuel cell;
an adjustment unit configured to adjust an amplitude of the AC signal at the positive output unit so as to converge a detection signal indicating the AC potential difference on a predetermined value, the predetermined value bringing about a match between the detection signal indicating the AC potential difference and an AC potential difference between the negative electrode terminal and the midpoint;
an in-phase component extraction unit configured to multiply the detection signal indicating the AC potential difference by an in-phase signal, and extract a resistance component of the detection signal indicating the AC potential difference, the in-phase signal being in phase with the AC signal having the predetermined frequency;

a calculation unit configured to calculate a positive real axis impedance on the basis of the resistance component and the output signal;

an orthogonal component extraction unit configured to multiply the detection signal indicating the AC potential difference by an orthogonal signal, and extract a capacitance component of the detection signal indicating the AC potential difference, a phase of the orthogonal signal being orthogonal to a phase of the AC signal having the predetermined frequency; and a reproduction unit configured to reproduce a vector value of the detection signal indicating the AC potential difference on the basis of the extracted capacitance component and resistance component, wherein the adjustment unit configured to adjust the amplitude of the AC signal at the positive output unit so that the reproduced vector value equals the predetermined value.

2. The impedance measuring device according to claim 1, wherein the in-phase component extraction unit includes:

an in-phase multiplication unit configured to output an in-phase AC signal by multiplying the detection signal indicating the AC potential difference by the in-phase signal; and an in-phase low-pass filter configured to remove a high-frequency domain of the in-phase AC signal while allowing the resistance component of the detection signal indicating the AC potential difference to pass therethrough, the orthogonal component extraction unit includes:

an orthogonal multiplication unit configured to output an orthogonal AC signal by multiplying the detection signal indicating the AC potential difference by the orthogonal signal; and an orthogonal low-pass filter configured to remove a high-frequency domain of the orthogonal AC signal while allowing the capacitance component of the detection signal indicating the AC potential difference to pass therethrough, and the reproduction unit outputs, as the vector value, a square root of a sum of a square of the resistance component and a square of the capacitance component.

3. The impedance measuring device according to claim 2, wherein the in-phase multiplication unit includes:

an operational amplifier including an inverting input terminal, a non-inverting input terminal, and an output terminal, the inverting input terminal receiving, as input, the detection signal indicating the AC potential difference, the non-inverting input terminal receiving, as input, the same detection signal indicating the AC potential difference as the inverting input terminal, and the output terminal being connected to the in-phase low-pass filter; and an in-phase switch configured to switch between an earthed state and a non-earthed state of the non-inverting input terminal in accordance with a rectangular pulse signal having the predetermined frequency, and cause the output terminal of the operational amplifier to output a rectified version of the in-phase AC signal, and the orthogonal multiplication unit includes:

an operational amplifier including an inverting input terminal, a non-inverting input terminal, and an output terminal, the inverting input terminal receiving, as input, the detection signal indicating the AC potential difference, the non-inverting input terminal receiving, as input, the same detection signal indicating the AC potential difference as the inverting input terminal, and the output terminal being connected to the orthogonal low-pass filter; and an orthogonal switch configured to switch between an earthed state and a non-earthed state of the non-inverting input terminal in accordance with an orthogonal pulse signal, and cause the output terminal of the operational amplifier to output a rectified version of the orthogonal AC signal, a phase of the orthogonal pulse signal being orthogonal to a phase of the rectangular pulse signal.

4. The impedance measuring device according to claim 2, wherein the in-phase multiplication unit includes:

a first multiplier configured to output a positive AC signal by multiplying the detection signal indicating the AC potential difference by a positive constant;

a second multiplier configured to output a negative AC signal by multiplying the detection signal indicating the AC potential difference by a negative constant; and an in-phase switch configured to switch between output from the first multiplier and output from the second multiplier in accordance with a rectangular pulse signal having the predetermined frequency, and output the in-phase AC signal rectified by the positive AC signal and the negative AC signal, and the orthogonal multiplication unit includes:

a third multiplier configured to output a positive AC signal by multiplying the detection signal indicating the AC potential difference by a positive constant;

a fourth multiplier configured to output a negative AC signal by multiplying the detection signal indicating the AC potential difference by a negative constant; and an orthogonal switch configured to switch between output from the third multiplier and output from the fourth multiplier in accordance with an orthogonal pulse signal, and output the orthogonal AC signal rectified by the positive AC signal and the negative AC signal, a phase of the orthogonal pulse signal being orthogonal to a phase of the rectangular pulse signal.

5. A control method for an impedance measuring device including: a fuel cell having a plurality of stacked battery cells, a capacitance component, and a resistance component, the capacitance component and the resistance component changing in accordance with a state of the battery cells; a positive output unit configured to be connected to a positive electrode terminal of the fuel cell, the positive output unit outputting an AC signal having a predetermined frequency for measuring an internal impedance of the fuel cell; a negative output unit configured to be connected to a negative electrode terminal of the fuel cell, the negative output unit outputting the AC signal having the predetermined frequency; and a detection unit configured to detect an AC potential difference between the positive electrode terminal and a midpoint of the fuel cell, the control method comprising:

adjusting an amplitude of the AC signal at the positive output unit so as to converge a detection signal indicating the AC potential difference detected by the detection unit on a predetermined value, the predetermined value bringing about a match between the detection signal indicating the AC potential difference and an AC potential difference between the negative electrode terminal and the midpoint;

multiplying the detection signal indicating the AC potential difference by an in-phase signal and extracting a resistance component of the detection signal indicating the AC potential difference, the in-phase signal being in phase with the AC signal having the predetermined frequency;

calculating a positive real axis impedance on the basis of the resistance component of the detection signal indicating the AC potential difference and the output signal output from the positive output unit;

multiplying the detection signal indicating the AC potential difference by an orthogonal signal and extracting a capacitance component of the detection signal indicating the AC potential difference, a phase of the orthogonal signal being orthogonal to a phase of the AC signal having the predetermined frequency; and reproducing a vector value of the detection signal indicating the AC potential difference on the basis of the extracted resistance component and the extracted capacitance component, wherein the amplitude of the AC signal at the positive output unit is adjusted so that the reproduced vector value equals the predetermined value.

* * * * *